United States Patent
Tanaka et al.

(10) Patent No.: US 9,493,871 B2
(45) Date of Patent: Nov. 15, 2016

(54) SURFACE-COATED CUTTING TOOL

(71) Applicant: MITSUBISHI MATERIALS CORPORATION, Tokyo (JP)

(72) Inventors: Koichi Tanaka, Naka (JP); Masakuni Takahashi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/648,155

(22) PCT Filed: Nov. 29, 2013

(86) PCT No.: PCT/JP2013/082152
§ 371 (c)(1),
(2) Date: May 28, 2015

(87) PCT Pub. No.: WO2014/084338
PCT Pub. Date: Jun. 5, 2014

(65) Prior Publication Data
US 2015/0292078 A1    Oct. 15, 2015

(30) Foreign Application Priority Data

| Nov. 30, 2012 | (JP) | ................................. 2012-262089 |
| Mar. 1, 2013 | (JP) | ................................. 2013-040822 |
| Nov. 28, 2013 | (JP) | ................................. 2013-245678 |

(51) Int. Cl.
*C23C 14/06* (2006.01)
*C23C 14/24* (2006.01)

(52) U.S. Cl.
CPC .......... *C23C 14/24* (2013.01); *C23C 14/0641* (2013.01)

(58) Field of Classification Search
USPC .......... 51/307, 309; 428/216, 336, 325, 697, 428/698, 699
See application file for complete search history.

(56) References Cited

U.S. PATENT DOCUMENTS

2004/0110039 A1    6/2004 Horling et al.
2010/0215912 A1    8/2010 Kubota et al.
(Continued)

FOREIGN PATENT DOCUMENTS

CN          1813078 A      8/2006
DE      102009046667 A     5/2011
(Continued)

OTHER PUBLICATIONS

Extended European Search Report mailed Sep. 18, 2015 for the corresponding European Application No. 13859368.6.
(Continued)

*Primary Examiner* — Archene Turner
(74) *Attorney, Agent, or Firm* — Leason Ellis LLP

(57) ABSTRACT

A surface-coated cutting tool includes a hard coating layer vapor-deposited on a surface of a tool body, in which a composition of the hard coating layer is expressed by a composition formula of $(Al_xTi_{1-x})N$ ($0.5 \leq x \leq 0.8$), the average layer thickness of the hard coating layer is 0.5 μm to 7.0 μm, the hard coating layer is formed of crystal grains having an average grain size of 5 nm to 50 nm, the hard coating layer have a mixed structure including cubic crystal grains having a rock-salt structure, and hexagonal crystal grains having a wurtzite structure, and {200} planes of the cubic crystal grains and {11-20} planes of the hexagonal crystal grains are oriented so as to be perpendicular to the surface of the tool body.

20 Claims, 8 Drawing Sheets

(56) References Cited

U.S. PATENT DOCUMENTS

| | | | |
|---|---|---|---|
| 2010/0233511 A1* | 9/2010 | Endler | C23C 16/029 428/698 |
| 2011/0003126 A1 | 1/2011 | Van Den Berg et al. | |
| 2012/0219789 A1 | 8/2012 | Endler et al. | |
| 2014/0234616 A1* | 8/2014 | Hultman | C23C 14/0641 428/336 |

FOREIGN PATENT DOCUMENTS

| | | | |
|---|---|---|---|
| JP | 2003-305601 A | | 10/2003 |
| JP | 2005-271133 A | | 10/2005 |
| JP | 2011-513594 A | | 4/2011 |
| JP | 2011-224715 A | | 11/2011 |
| JP | 2103-116509 | * | 6/2013 |
| WO | WO-2011/041063 A | | 4/2011 |
| WO | WO-2011/058132 A | | 5/2011 |
| WO | WO-2013/045454 A | | 4/2013 |

OTHER PUBLICATIONS

International Search Report mailed Feb. 4, 2014 for the corresponding PCT Application No. PCT/JP2013/082152.

Office Action mailed Apr. 11, 2016 for the corresponding Chinese Patent Application No. 201380062141.X.

* cited by examiner

US 9,493,871 B2

SURFACE-COATED CUTTING TOOL

CROSS-REFERENCE TO RELATED PATENT APPLICATIONS

This application is a U.S. National Phase Application under 35 U.S.C. §371 of International Patent Application No. PCT/JP2013/082152, filed Nov. 29, 2013, and claims the benefit of Japanese Patent Applications No. 2012-262089, filed Nov. 30, 2012, No. 2013-040822, filed Mar. 1, 2013 and No. 2013-245678, filed Nov. 28, 2013, all of which are incorporated by reference in their entirety herein. The International Application was published in Japanese on Jun. 5, 2014 as International Publication No. WO/2014/084338 under PCT Article 21(2).

FIELD OF THE INVENTION

The present invention relates to a surface-coated cutting tool provided with a hard coating layer having excellent wear resistance, and more particularly, to a surface-coated cutting tool (hereinafter, referred to as coated tool) which exhibits an excellent cutting performance over a long period of time even in a case where the surface-coated cutting tool is used for high-speed intermittent turning of high hardness steel such as carbon steel, stainless steel, or alloy steel.

BACKGROUND OF THE INVENTION

In general, as coated tools, there are inserts which are detachably attached to the tip end portion of an insert holder to be used for turning or planing of a workpiece, such as various types of steels and cast iron, drills or miniature drills used for drilling or the like of a workpiece, and solid type end mills used for facing, grooving, shoulder milling, and the like of a workpiece. In addition, as coated tools, insert type end mills and the like are also known which include inserts detachably attached thereto and perform cutting in the same manner as solid type end mills.

Hitherto, as one of the coated tools, a coated tool is known which includes a hard coating layer having a plurality of layers formed by chemical vapor deposition (CVD), has a structure in which an outer layer is made of $Ti_{1-x}Al_xN$, $Ti_{1-x}Al_xC$, and/or $Ti_{1-x}Al_xCN$ ($0.65 \leq x \leq 0.9$, preferably $0.7 \leq x \leq 0.9$), the outer layer has a compressive stress between 100 MPa and 1100 MPa, and preferably, between 400 MPa and 800 MPa, and a TiCN layer or $Al_2O_3$ layer is disposed under the outer layer, and therefore exhibits excellent heat resistance and cycle fatigue strength (refer to PTL 1).

In addition, as one of the coated tools, a coated tool is known which includes a tool body, a wear-resistant layer formed on the tool body, and an outermost layer formed on the wear-resistant layer, in which the wear-resistant layer is made of a nitride, carbonitride, oxynitride, or oxycarbonitride of a first element and has a cubic crystal structure, and the first element is any one of (1) to (3):

$(Ti_xAl_y)$ where $0.3 \leq x \leq 0.7$, $0.3 \leq y \leq 0.7$, $x+y=1$      (1)

$(Ti_xAl_ySi_z)$ where $0.3 \leq x \leq 0.7$, $0.3 \leq y \leq 0.7$, $0.05 \leq z \leq 0.2$, $x+y+z=1$      (2)

$(Ti_xSi_z)$ where $0.8 \leq x \leq 0.95$, $0.05 \leq z \leq 0.2$, $x+z=1$      (3)

the outermost layer is made of a nitride, carbonitride, oxynitride, or oxycarbonitride of Al which is a second element, and has a hexagonal crystal structure, and the coated tool satisfies conditions of:

(a) the total film thickness of the wear-resistant layer and the outermost layer is 0.5 μm to 15.0 μm, and (b) the film thickness of the outermost layer is 0.1 μm to 5.0 μm (refer to PTL 2).

In addition, as another coated tool, a coated tool is known in which a hard coating layer made of (Al,Ti)N is vapor-deposited on the surface of a tool body made of a sintered tungsten carbide-based cemented carbide, the hard coating layer has a structure in which a thin layer A made of granular (Al,Ti)N crystals and a thin layer B made of columnar (Al,Ti)N crystals are alternately laminated, each of the thin layer A and the thin layer B has a layer thickness of 0.05 μm to 2 μm, the crystal grain size of the granular crystals is 30 nm or less, and the crystal grain size of the columnar crystals is 50 nm to 500 nm, and therefore excellent wear resistance to high-speed intermittent cutting of high hardness steel is exhibited (refer to PTL 3).

CITATION LIST

Patent Literature

[PTL 1] Japanese Unexamined Patent Application (Kohyo) No. 2011-513594
[PTL 2] Japanese Unexamined Patent Application, First Publication No. 2005-271133
[PTL 3] Japanese Unexamined Patent Application, First Publication No. 2011-224715

Technical Problem

In recent years, the performance of a cutting apparatus has been remarkably enhanced, and there has been a strong demand for power saving and energy saving during cutting and a further reduction in cost. In accordance with this, there is a tendency toward an increase in the speed of the cutting work. For example, although there is no particular problems in a case where an conventional coated tool formed by vapor-depositing a (Ti,Al)N layer or the like as the hard coating layer is used for cutting under standard conditions of steel or cast iron, particularly in a case where the conventional coated tool is used for high-speed intermittent turning of high hardness steel such as carbon steel, stainless steel, or alloy steel, accompanied by the generation of high temperature heat during cutting, it cannot be said that the oxidation resistance and the fracturing resistance of the hard coating layer are sufficient, and there is concern that fracturing, crack advance, chipping, and the like may occur in the hard coating layer. In addition, in an conventional coated tool formed by vapor-depositing a (Ti,Al)-based carbonitride layer as the hard coating layer, the wear resistance thereof is not satisfactory during high-speed intermittent turning of stainless steel, alloy steel, or the like. Therefore, in the current situation, any conventional coated tool reaches the end of its service life within a relatively short time.

The present invention has been made taking the foregoing circumstances into consideration, and an object thereof is to provide a surface-coated cutting tool which includes a hard coating layer that exhibits excellent cutting performance during intermittent cutting of high hardness steel such as stainless steel or alloy steel and therefore has a longer service life than that of an conventional coated tool.

SUMMARY OF THE INVENTION

Solution to Problem

From the above-described viewpoints, the inventors conducted researches while focusing on the hard coating layer of the conventional coated tool in order to develop a coated tool which includes a hard coating layer that exhibits excellent oxidation resistance and fracturing resistance particularly during intermittent cutting of stainless steel, alloy steel, or the like and exhibits excellent impact resistance and wear resistance, and obtained the following knowledge.

(a) In the conventional coated tool having the hard coating layer formed of the (Al,Ti)N layer, Al which is a component of the hard coating layer enhancing high-temperature hardness and heat resistance, Ti has an action of enhancing high-temperature hardness, and high-temperature oxidation resistance is enhanced in a state where Al and Ti are contained to coexist with each other.

(b) In addition to the crystal grains having the rock-salt (NaCl type) crystal structure (hereinafter, also referred to as the rock-salt structure), which is obtained under the condition where the bias voltage is DC, crystal grains having the wurtzite (ZnS type), which is different from the rock-salt structure, can be obtained by: pulse-controlling the bias voltage applied to the tool body during film formation; and changing its duty cycle at the same time.

In addition, the orientation of crystal grains can be controlled by a time operation in addition to the energy applied to the raw material of films and the temperature of the tool body during film formation.

(c) The (Al,Ti)N layer having the rock-salt crystal structure has high hardness. Therefore, although the wear resistance of the coated tool can be enhanced by forming the (Al,Ti)N layer on the tool body, fracturing or chipping is likely to occur.

(d) Fracturing resistance can be enhanced by having a mixed structure including both (Al,Ti)N crystal grains having the rock-salt crystal structure and (Al,Ti)N crystal grains having a wurtzite crystal structure that is chemically stable and has excellent lubricity.

(e) In a case where (Al,Ti)N crystal grains having the rock-salt crystal structure and (Al,Ti)N crystal grains having the wurtzite crystal structure are randomly formed, due to the difference in crystal structure, detachment is likely to occur at the boundary surface between both the crystal grains, and the tool life is shortened.

(f) By subjecting a bias voltage applied to the tool body during film formation to pulse control, (Al,Ti)N crystal grains having the rock-salt crystal structure and (Al,Ti)N crystal grains having the wurtzite crystal structure can be respectively oriented in lower-order plane directions of specific directions. Accordingly, the adhesion between (Al,Ti)N crystal grains having the rock-salt crystal structure and (Al,Ti)N crystal grains having the wurtzite crystal structure is enhanced, and therefore excellent film characteristics are exhibited in cooperation with the characteristics of both of the crystal grains.

(g) The hard coating layer which satisfies the conditions of (a) to (f) is less likely to self-destruct even when the compressive residual stress of the hard coating layer is increased. As a result, the compactness of the hard coating layer is improved, and therefore the tool can have a long life.

The present invention has been made based on the research results and has the following aspects.

(1) A surface-coated cutting tool including: a hard coating layer which is vapor-deposited on a surface of a tool body made of a sintered tungsten carbide-based cemented carbide, in which (a) a composition of the hard coating layer is expressed by a composition formula of $(Al_xTi_{1-x})N$ ($0.5 \leq x \leq 0.8$), and an average layer thickness of the hard coating layer is 0.5 µm to 7.0 µm, (b) the hard coating layer is formed of crystal grains having an average grain size of 5 nm to 50 nm, (c) the crystal grains have a mixed structure including both cubic crystal grains having a rock-salt structure, and hexagonal crystal grains having a wurtzite structure, and (d) {200} planes of the cubic crystal grains and {11-20} planes of the hexagonal crystal grains are oriented so as to be perpendicular to the surface of the tool body.

(2) The surface-coated cutting tool described in (1), in which the composition of the hard coating layer is expressed by a composition formula of $(Al_xTi_{1-x})N$ ($0.6 \leq x \leq 0.8$), and the average layer thickness of the hard coating layer is 0.5 µm to 5.0 µm, and a compressive residual stress of the hard coating layer is 8 GPa to 12 GPa.

(3) The surface-coated cutting tool described in (1) or (2), in which the average aspect ratio of the crystal grains is 3 or lower.

(4) The surface-coated cutting tool described in any of (1) to (3), in which, in an electron diffraction pattern observed by irradiating electron beams in a cross-sectional direction of the hard coating layer, portions of diffraction rings derived from the rock-salt structure and portions of diffraction rings derived from the wurtzite structure are observed, and both of a diffraction arc of a (200) plane of the rock-salt structure and a diffraction arc of a (11-20) plane of the wurtzite structure are not complete circles and are arcs, and an angular width of each of the diffraction arc derived from the (200) plane of the rock-salt structure and the diffraction arc derived from the (11-20) plane of the wurtzite structure is 60 degrees or lower, and regarding each of the diffraction arc derived from the (200) plane of the rock-salt structure and the diffraction arc derived from the (11-20) plane of the wurtzite structure, an angle $\phi$ (here, $\phi \leq 90°$) between a straight line connecting a radius center of the diffraction arc with a midpoint of an opening angle of the diffraction arc and the surface of the tool body is 75 degrees or higher.

(5) The surface-coated cutting tool described in any of (1) to (4), in which, in the electron diffraction pattern observed by irradiating the electron beams in the cross-sectional direction of the hard coating layer, in a case where an intensity profile of a diffraction pattern in the direction perpendicular to the surface of the tool body is calculated, when a diffraction intensity of the diffraction arc of the (200) plane of the rock-salt structure is referred to as Ic and a diffraction intensity of the diffraction arc of the (11-20) plane of the wurtzite structure is referred to as Ih, $0.82 \geq Ic/(Ic+Ih) \geq 0.3$ is satisfied.

(6) The surface-coated cutting tool described in any of (1) to (5), in which an upper portion layer which is made of any of TiN, (Ti,Al)N, Ti(C,N), (Al,Cr)N, and CrN and has an average layer thickness of 0.1 µm to 0.3 µm is present at an upper layer of the hard coating layer, or a lower portion layer which is made of any of TiN, (Ti,Al)N, Ti(C,N), (Al,Cr)N, and CrN and has an average layer thickness of 0.5 µm to 1.5 µm is present at a lower layer of the hard coating layer.

(7) The surface-coated cutting tool described in any of (1) to (5), in which a lower portion layer which is made of any of TiN, (Ti,Al)N, Ti(C,N), (Al,Cr)N, and CrN and has an average layer thickness of 0.5 µm to 1.5 µm is formed at a lower layer of the hard coating layer.

(8) The surface-coated cutting tool described in (7), in which an upper portion layer which is made of any of TiN, (Ti,Al)N, Ti(C,N), (Al,Cr)N, and CrN and has an average layer thickness of 0.1 µm to 0.3 µm is formed at an upper layer of the hard coating layer.

(9) The surface-coated cutting tool described in (8), in which the lower portion layer is made of TiN, and the upper portion layer is made of CrN.

(10) The surface-coated cutting tool described in (7), in which the lower portion layer is made of (Al,Cr)N.

(11) The surface-coated cutting tool described in (1) or (2), in which the average aspect ratio of the crystal grains is 1.4 to 1.8.

In the surface-coated cutting tool of the present invention, it is preferable that the hard coating layer be vapor-deposited on the tool body by an ion plating method using a pressure-gradient type plasma gun, and that during the vapor deposition, a bias voltage subjected to pulse control be applied to the tool body.

In addition, in the surface-coated cutting tool of the present invention, it is more preferable that the hard coating layer be vapor-deposited on the tool body by an ion plating method using a pressure-gradient type plasma gun, and that during the vapor deposition, a bias voltage subjected to pulse control and a DC bias voltage be applied to the tool body.

Advantageous Effects of Invention

A surface-coated cutting tool according to an aspect of the present invention is the surface-coated cutting tool including the hard coating layer which is vapor-deposited on the surface of the tool body made of the sintered tungsten carbide-based cemented carbide. In the surface-coated cutting tool, the composition of the hard coating layer is expressed by a composition formula of $(Al_xTi_{1-x})N$ ($0.5 \leq x \leq 0.8$), and the average layer thickness of the hard coating layer is 0.5 μm to 7.0 μm. The hard coating layer is formed of fine crystal grains having an average grain size of 5 nm to 50 nm. The hard coating layer has a mixed structure including both the cubic crystal grains having the rock-salt structure, and the hexagonal crystal grains having the wurtzite structure. The {200} planes of the cubic crystal grains are oriented so as to be perpendicular to the surface of the tool body, and the {11-20} planes of the hexagonal crystal grains are oriented so as to be perpendicular to the surface of the tool body. By employing the above configurations, the hard coating layer of the surface-coated cutting tool which is the aspect of the present invention has excellent wear resistance and fracturing resistance. As a result, the surface-coated cutting tool of the present invention has a long life. Furthermore, since the orientation of each of the crystal grains is controlled to be a specific direction, the wear resistance of individual crystal grains is further enhanced.

A surface-coated cutting tool according to another aspect of the present invention is the surface-coated cutting tool including the hard coating layer which is vapor-deposited on the surface of the tool body made of the sintered tungsten carbide-based cemented carbide. In the surface-coated cutting tool, the composition of the hard coating layer is expressed by a composition formula of $(Al_xTi_{1-x})N$ ($0.6 \leq x \leq 0.8$), and the average layer thickness of the hard coating layer is 0.5 μm to 5.0 μm. The hard coating layer is formed of fine crystal grains having an average grain size of 5 nm to 50 nm. The hard coating layer has a mixed structure including both the cubic crystal grains having the rock-salt structure, and the hexagonal crystal grains having the wurtzite structure. The {200} planes of the cubic crystal grains are oriented so as to be perpendicular to the surface of the tool body, and the {11-20} planes of the hexagonal crystal grains are oriented so as to be perpendicular to the surface of the tool body. Furthermore, the compressive residual stress of the hard coating layer is 8 GPa to 12 GPa. By employing the above configurations, in the hard coating layer of the surface-coated cutting tool which is another aspect of the present invention, since two phases having different crystal structures are present as a fine structure with mixed phases, wear resistance is enhanced. In addition, by making the two phases respectively oriented in specific lower-order plane directions, further excellent wear resistance is exhibited, and the life of the coated tool can be increased.

DETAILED DESCRIPTION OF THE INVENTION (First Embodiment)

A first embodiment of a coated tool of the present invention will be described with reference to the drawings.

Figure 2A:
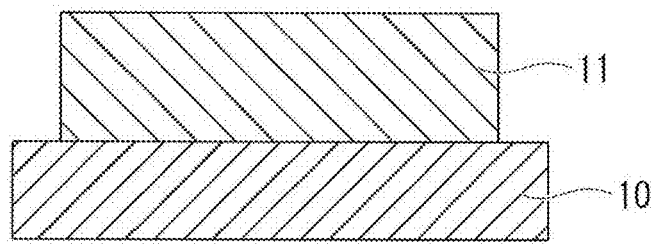
FIG. 2A is a schematic cross-sectional view of a coated tool according to an embodiment of the present invention, and is a schematic cross-sectional view of the coated tool in which a hard coating layer is formed.

FIG. 2A is a schematic cross-sectional view of a coated tool in which a hard coating layer is formed. As shown in FIG. 2A, the coated tool of this embodiment includes, as primary constituent elements, a tool body 10 made of a sintered tungsten carbide-based cemented carbide and a hard coating layer 11 which is vapor-deposited on the surface thereof. The composition of the hard coating layer 11 is expressed by a composition formula of $(Al_xTi_{1-x})N$ (0.5≤x≤0.8), and the average layer thickness of the hard coating layer 11 is 0.5 µm to 7.0 µm.

The reason that the content x of Al with respect to the total amount of Al and Ti in $(Al_xTi_{1-x})N$ is 0.5 to 0.8 will be described. The crystal structure of $(Al_xTi_{1-x})N$ is transformed from a rock-salt crystal structure to a wurtzite crystal structure with x=0.5 to 0.8 as the boundary region. That is, in a region where 0.5≤x≤0.8 is achieved, the rock-salt crystal structure and the wurtzite crystal structure can coexist with each other. In a method described later, by switching the negative voltage of a pulse bias voltage applied to the tool body 10 between ON and OFF with a predetermined duty ratio, the structure of the hard coating layer 11 which is a composite nitride film with a composition of $(Al_xTi_{1-x})N$ (0.5≤x≤0.8) can be controlled to form a structure in which cubic crystal grains having the rock-salt crystal structure and hexagonal crystal grains having the wurtzite crystal structure coexist with each other, with good reproducibility. In addition, by allowing the average layer thickness of the hard coating layer 11 to be 0.5 µm to 7.0 µm, chipping of films caused by an increase in the thickness is prevented, and the desired wear resistance can be exhibited.

Figure 2B:
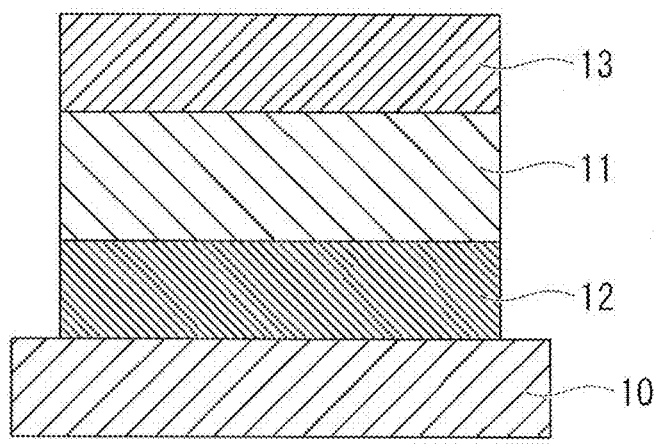
FIG. 2B is a schematic cross-sectional view of the coated tool according to the embodiment of the present invention, and is a schematic cross-sectional view of the coated tool in which an upper portion layer is formed at the upper layer of the hard coating layer and a lower portion layer is formed at the lower layer of the hard coating layer.

FIG. 2B is a schematic cross-sectional view of a coated tool in which an upper portion layer 13 is formed at the upper layer (the outermost layer of the coated tool) of the hard coating layer 11 and a lower portion layer 12 is formed at the lower layer of the hard coating layer 11 (between the hard coating layer 11 and the tool body 10). As shown in FIG. 2B, it is preferable that the predetermined upper portion layer 13 or the lower portion layer 12 be formed at the upper layer or the lower layer of the hard coating layer 11. Although the hard coating layer 11 independently shows excellent characteristics, the cutting performance of the coated tool can be further enhanced by forming the upper portion layer 13 or the lower portion layer 12. Particularly, by providing the lower portion layer 12, the wear resistance of the film formed on the tool body 10 (a film composed of the hard coating layer, the upper portion layer, and the lower portion layer formed on the tool body 10), can be enhanced.

The hard coating layer 11 of this embodiment employs the following structure in addition to the above-described configuration, and therefore exhibits extremely excellent cutting performance.

(a) Orientation of Cubic Crystal Grains and Hexagonal Crystal Grains:

In the hard coating layer 11 described above, most of the {200} planes of cubic crystal grains are oriented so as to be perpendicular to the surface of the tool body 10, and most of the {11-20} planes of hexagonal crystal grains are oriented so as to be perpendicular to the surface of the tool body 10. In the hard coating layer 11 like this, a unique crystal grain structure which is a fine structure and is oriented in a lower-order plane direction, is formed, and therefore further excellent wear resistance and fracturing resistance are exhibited.

Specifically, in a region in which the content of Al with respect to the total amount of Al and Ti is 0.5 or higher, the hard coating layer 11 exhibits high wear resistance due to the effect of Al which enhances high-temperature hardness and heat resistance. In addition to this, co-existence of crystal grains with the cubic rock-salt structure and crystal grains with the hexagonal wurtzite structure promotes formation of a finer crystal grain structure. As a result, the hard coating layer 11 exhibits excellent wear resistance. In addition, in a cross-section (see FIG. 3A) of the hard coating layer 11, which will be described later, it is preferable that the sum of the area occupied by the cubic crystal grains with the rock-salt structure and the area occupied by the hexagonal crystal grains with the wurtzite structure be 70% or higher of the area of the entire cross-section. Moreover, it is more preferable that the hard coating layer 11 be constituted only by the cubic crystal grains with the rock-salt structure, the hexagonal crystal grains with the wurtzite structure, and the grain boundaries between these crystal grains. In this configuration, the above-described wear resistance and fracturing resistance are sufficiently exhibited.

Hitherto, in a fine crystal grain structure with a mixed structure including both crystal grains having a rock-salt structure and crystal grains having a wurtzite structure, each of the crystal grains is randomly directed, and therefore many random grain boundaries are formed. Accordingly, the bonding force between the crystal grains is reduced and therefore the grains are likely to be separated due to impact. As a result, it is difficult to ensure sufficient performance to bear practical use in a hard coating layer for a tool. Contrary to this, in the hard coating layer 11 of this embodiment, since the crystal grains with the rock-salt structure and the crystal grains with the wurtzite structure have predetermined orientation, sufficient wear resistance and fracturing resistance for a hard coating layer for a tool can be ensured. That is, since most of the crystal grains have predetermined orientation, even in a case where crystal grains that are adjacent to each other have different crystal structures, anisotropy in the grain boundary between the crystal grains is relieved. In addition, regarding the predetermined orientation, the {200} planes of the cubic crystal grains and the {11-20} planes of the hexagonal crystal grains are oriented so as to be perpendicular to the surface of the tool body 10. Therefore, since the arrangement of atoms of the {10-10} plane perpendicular to the {11-20} plane among the crystal planes of the wurtzite structure is close to the arrangement of atoms of the {011} plane perpendicular to the {200} plane among the crystal planes of the rock-salt structure, many of grain boundaries having high coordination with low energy are formed, and thereby the bonding force between the crystal grains increases. As a result, the fracturing resistance of the entire film is enhanced. In addition, the ratio of the area of the cubic crystal grains of which the {200} planes are oriented at 15 degrees or lower from a direction perpendicular to the surface of the tool body 10, to the area occupied by the cubic crystal grains with the rock-salt structure in the cross-section (see FIG. 3A) of the hard coating layer 11, which will be described later, is preferably 50% to 100%, and is more preferably 80% to 100%. Similarly, the ratio of the area of the hexagonal crystal grains, of which the {11-20} planes are oriented at 15 degrees or lower from the direction perpendicular to the surface of the tool body 10, to the area occupied by the hexagonal crystal grains with the wurtzite structure in the cross-section of the hard coating layer 11, is preferably 50% to 100%, and is more preferably 80% to 100%.

(b) Average Grain Size and Average Aspect Ratio of Fine Crystal Grains:

The average grain size of fine crystal grains included in the hard coating layer 11 is 5 nm to 50 nm. Accordingly, the hardness and fracturing resistance of the hard coating layer can be enhanced. When the average grain size is smaller than 5 nm, the crystal grains are too fine, and therefore the characteristics of nitride crystals are weakened, resulting in a reduction in the hardness of the hard coating layer. On the other hand, when the average grain size is greater than 50 nm, the crystal grains are too coarse, and therefore desired fracturing resistance cannot be obtained. In addition, when the average value of the aspect ratios of the fine crystal grains, that is, the average aspect ratio thereof is higher than 3, the anisotropy in the crystal grains becomes too high and therefore cracks are likely to advance in the major axis direction, resulting in the degradation of fracturing resistance. Therefore, it is more preferable that the average aspect ratio of the fine crystal grains be 3 or lower.

Figure 3A:
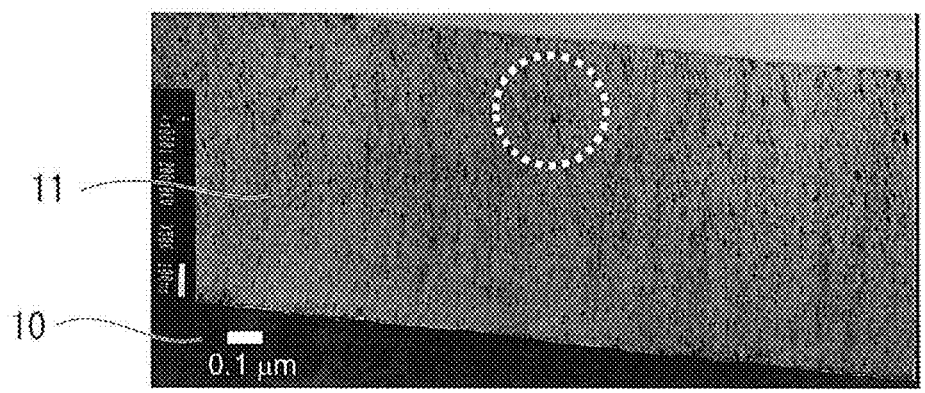
FIG. 3A is a transmission electron micrograph of the cross-section of the coated tool according to the embodiment of the present invention.

In addition, calculation of the average grain size and the average aspect ratio of the fine crystal grains is performed as follows. First, a cross-section in a visual field magnified at tens of thousands to hundreds of thousands times (for example, 20000 times) is observed by a transmission electron microscope. FIG. 3A is a transmission electron micrograph of the cross-section in this embodiment. As shown in FIG. 3A, the cross-section observed by the transmission electron microscope is a cut surface cut from the tool body 10 and the hard coating layer 11 by a plane including a direction perpendicular to the surface of the tool body 10. In the following description, a direction perpendicular to a line showing the surface of the tool body 10 in the observed cross-section is referred to as a film thickness direction, and a direction perpendicular to the observed cross-section (a direction perpendicular to FIG. 3A) is referred to as a cross-sectional direction. The range of the cross-section in which the crystal grain size and the average aspect ratio are measured by the transmission electron microscope, is determined on the basis of the average layer thickness determined in advance through observation by a scanning electron microscope. The average layer thickness is determined by measuring the layer thicknesses of a plurality of points in the cross-section and obtaining the average thereof. In an observation visual field, a rectangular region of the average layer thickness×several micrometers defined by a line segment which is the same as the length of the average layer thickness in the film thickness direction from an arbitrary point on the surface of the tool body 10 as the starting point and a line segment of several micrometers (for example, 5 μm) perpendicular to the film thickness direction from the same starting point, is determined as the measurement range. The crystal grain size and the aspect ratio of each of all crystal grains in the measurement range are measured. Measurement is performed by using a line segment representing the maximum length of each crystal grain as a major axis (grain length) and using a line segment representing the maximum width of the crystal grain in a direction perpendicular to the major axis as a minor axis (grain width). The average value of the major axis and the minor axis is referred to as a crystal grain size, and a value obtained by dividing the value of the major axis by the value of the minor axis is referred to as an aspect ratio. In addition, the average values of the crystal grain sizes and the aspect ratios of all the crystal grains in the measurement range are respectively referred to as the average grain size and the average aspect ratio.

Figure 3B:
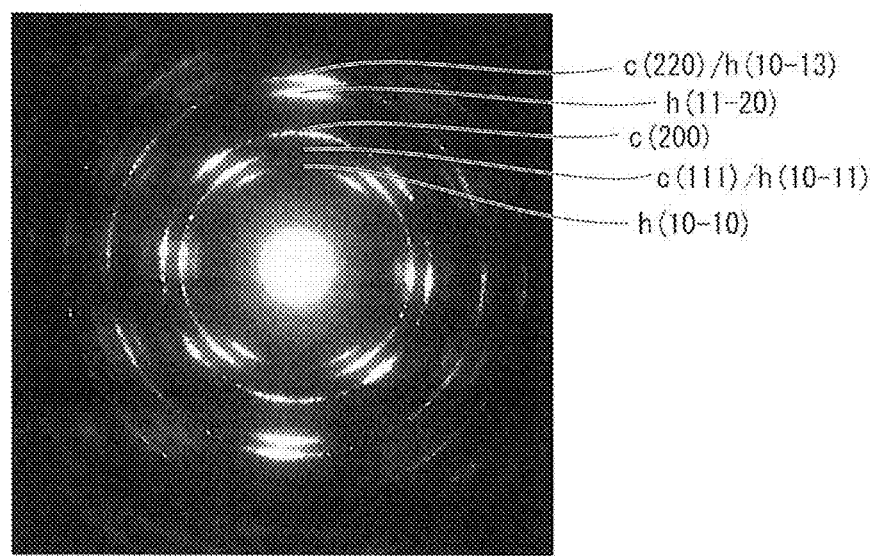
FIG. 3B is an electron diffraction pattern obtained by irradiating the cross-section of the hard coating layer of the coated tool according to the embodiment of the present invention with electron beams.
Figure 4:
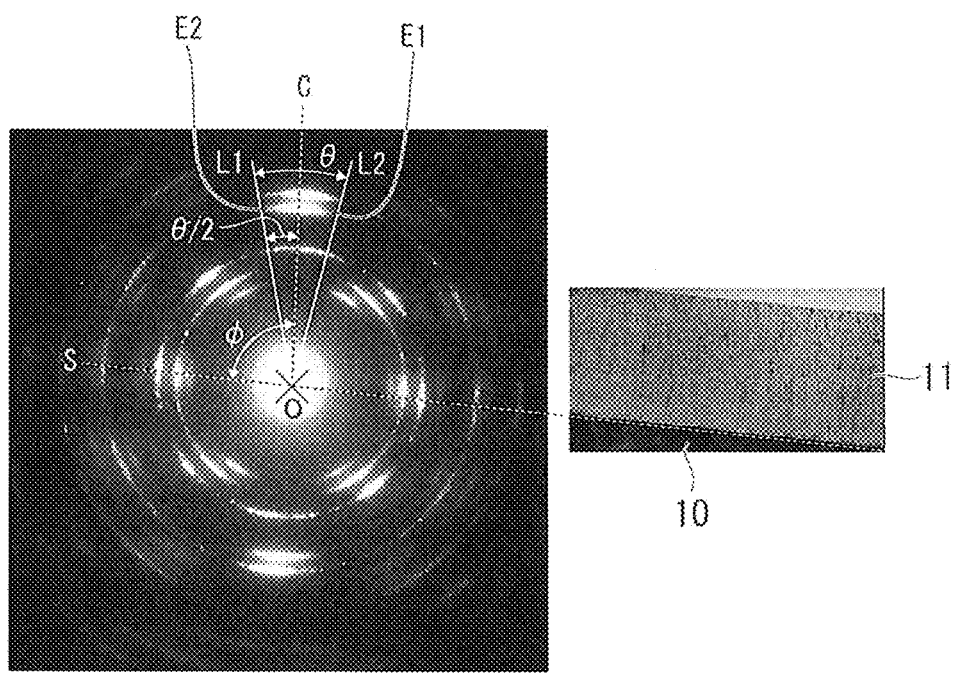
FIG. 4 is an example of an electron diffraction image showing angular widths, the midpoint of an opening angle, and the like in the hard coating layer of the coated tool according to the embodiment of the present invention.
Figure 5A:
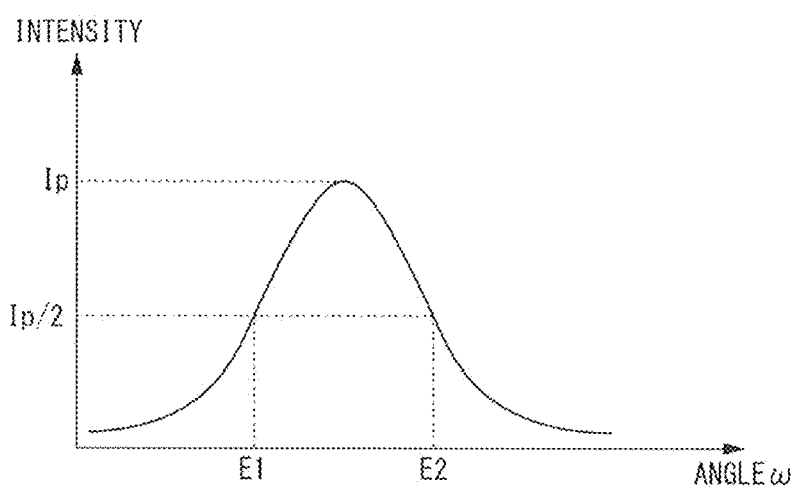
FIG. 5A is an example of an intensity profile showing the ends of an arc in the electron diffraction pattern.
Figure 5B:
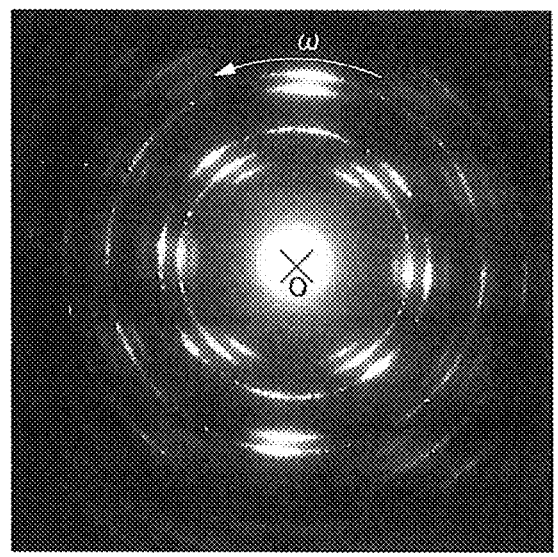
FIG. 5B is a view showing an angle in the electron diffraction pattern.

(c) Angular Widths of Diffraction Arc of (200) Plane of Rock-Salt Structure and Diffraction Arc of (11-20) Plane of Wurtzite Structure:

FIG. 3B is an electron diffraction pattern obtained by irradiating the cross-section of the hard coating layer 11 with electron beams. Such an electron diffraction pattern is observed by using the transmission electron microscope (TEM). A sample of a thin film having the cross-section shown in FIG. 3A as the observation surface, is produced, and a certain region in the sample, for example, a region surrounded by a dotted line of FIG. 3A, is irradiated with electron beams having a spot diameter corresponding to the layer thickness of the hard coating layer 11 in a cross-sectional direction of the hard coating layer 11, thereby obtaining the electron diffraction pattern shown in FIG. 3B. In the electron diffraction pattern, a plurality of diffraction rings or portions thereof around the irradiation axis O (see FIG. 4) of the electron beams are observed. Here, the irradiation axis O of the electron beams is in a direction perpendicular to the electron diffraction pattern of FIG. 3B (FIG. 4 or FIG. 5B). Since the hard coating layer 11 have a mixed structure including both the cubic crystal grains with the rock-salt structure and the hexagonal crystal grains with the wurtzite structure, in FIG. 3B, portions of the diffraction rings derived from the rock-salt structure and the diffraction rings or portions (arcs) thereof derived from the wurtzite structure, are observed. In addition, in FIG. 3B, c(hkl) represents the diffraction pattern of (hkl) plane derived from the rock-salt structure, and h(hkil) represents the diffraction pattern of (hkil) plane derived from the wurtzite structure. For example, c(200) is a diffraction pattern derived from the (200) planes of the cubic crystal grains with the rock-salt structure, and h(11-20) is a diffraction pattern derived from the (11-20) planes of the hexagonal crystal grains with the wurtzite structure.

Since the {200} planes of the cubic crystal grains and the {11-20} planes of the hexagonal crystal grains in the hard coating layer 11 are oriented in the predetermined orientations, in FIG. 3B, both of the diffraction pattern derived from the (200) planes of the cubic crystal grains and the diffraction pattern derived from the (11-20) planes of the hexagonal crystal grains, are observed not as complete circles but as arcs.

FIG. 4 is a view showing a method of measuring angles in the electron diffraction pattern of FIG. 3B. As shown in FIG. 4, when the angular width (central angle) of a diffraction are is referred to as θ, the angular width θ of the diffraction arc derived from the (200) planes of the cubic crystal grains and the diffraction arc derived from the (11-20) planes of the hexagonal crystal grains, is preferably 60 degrees or lower. Such an electron diffraction pattern is observed in a case where the volume ratio of the cubic crystal grains of which the {200} planes are oriented in a range of 15 degrees or lower from a specific direction and the volume ratio of the hexagonal crystal grains of which the {11-20} planes are oriented in a range of 15 degrees or lower from the specific direction in the entire hard coating layer 11, is high. In this case, the {10-10} plane perpendicular to the {11-20} plane in the wurtzite structure and the {011} plane perpendicular to the {200} plane in the rock-salt structure are oriented so as to be substantially parallel to each other, and therefore the bonding force between the crystal grains is increased as described above. As a result, the fracturing resistance and the wear resistance of the hard coating layer 11 can be enhanced. Contrary to this, when the angular width θ is higher than 60 degrees, desired orientation cannot be obtained, and therefore it is difficult to sufficiently enhance the fracturing resistance and wear resistance, which is not preferable.

(d) Angle φ Between Line Segment (Straight Line) Connecting Radius Center of Arc with Midpoint of Opening Angle of Arc and Surface of Tool Body:

It is preferable that an angle φ (here, φ≤900) between a straight line C (a bisector C of the angular width θ) connecting the midpoint of the opening angle of the arc (the midpoint of the arc) having the angular width θ with the radius center of the arc (the center of the arc and the irradiation axis O of the electron beams) and the surface S of the tool body 10 on the electron diffraction pattern, be 75 degrees or higher. Such an electron diffraction pattern is observed in a case where the volume ratio of the cubic crystal grains in which the angle between the {200} plane and the surface of the tool body 10 is 75 degrees to 90 degrees and the volume ratio of the hexagonal crystal grains in which the angle between the {11-20} plane and the surface of the tool body 10 is 75 degrees to 90 degrees in the entire hard coating layer 11, is high. In this case, the wear resistance of the hard coating layer 11 can be enhanced. When the angle φ is lower than 75 degrees, a specific direction in which wear resistance is exhibited, that is, the {011} plane of the cubic crystal grains and the {10-10} plane of the hexagonal crystal grains, are oriented so as to be inclined with respect to the surface of the tool body 10. Therefore, it is difficult to bear stress or impact applied to the tool body 10 during cutting, and therefore it is difficult to ensure desired wear resistance, which is not preferable.

Next, a method of determining the angular width θ of the diffraction arc and the midpoint of the opening angle of the arc will be described. FIG. 5A is a view showing an intensity profile in the electron diffraction pattern, and FIG. 5B is a view showing an angle ω in the electron diffraction pattern. First, a diffraction ring, which complements a diffraction are around the irradiation axis O of the electron beams of FIG. 5B, is assumed. Next, the intensity value of a diffraction line on the circumference of the ring is plotted on a graph in which the vertical axis represents intensity and the horizontal axis represents the angle ω such that the intensity profile is generated. FIG. 5A is an intensity profile of a specific arc generated as described above. In addition, in an intensity profile corresponding to an arc of which the angular width θ and the midpoint of the opening angle of the arc are to be obtained, angles ω having a intensity that is half of the maximum value Ip, are referred to as a first end E1 and a second end E2 of the diffraction arc. The size of the angle between a straight line L1 connecting the irradiation axis O of the electron beams with the first end E1 and a straight line L2 connecting the irradiation axis O of the electron beams with the second end E2, is determined as the angular width θ of the diffraction arc. Furthermore, a position where the bisector C of the angle between the straight line L1 and the straight line L2 intersects the diffraction arc, is determined as the midpoint of the opening angle of the diffraction arc.

In addition, as a method of digitizing the intensity from the electron diffraction pattern, there is a method of converting a diffraction pattern received by a computer into a grayscale digital image to be digitized as a two-dimensional intensity profile.

(e) Value of Ic/(Ic+Ih) when Intensity of (200) Diffraction Line of Rock-Salt Structure is Referred to as Ic and Intensity of (11-20) Diffraction Line of Wurtzite Structure is Referred to as Ih:

In the electron diffraction pattern, it is preferable that the value of Ic/(Ic+Ih) be 0.3 to 0.8 when the intensity of the (200) diffraction line of the rock-salt structure in a direction perpendicular to the surface S of the tool body 10 is referred to as Ic and the intensity of the (11-20) diffraction line of the wurtzite structure is referred to as Ih. Such an electron diffraction pattern is obtained in a case where the {200} planes of the cubic crystal grains with the rock-salt structure and the {11-20} planes of the hexagonal crystal grains with the wurtzite structure are oriented so as to be perpendicular to the surface of the tool body 10 and the presence ratios (volume ratios) of the cubic crystal grains and the hexagonal crystal grains to the crystal grains oriented as described above are appropriate. In this case, the hard coating layer 11 has sufficient wear resistance. When this value is lower than 0.3, the proportion of the cubic crystal grains with the rock-salt structure, a hard phase, is relatively low, and therefore desired wear resistance cannot be obtained. On the other hand, when the value is higher than 0.8, the characteristics of the crystal grains with the rock-salt structure become dominant, and therefore an effect of enhancing hardness and wear resistance by composing the hard coating layer 11 with two mixed phases is reduced. Therefore, a desired tool life cannot be obtained. Therefore, it is preferable that 0.8≥Ic/(Ic+Ih)≥0.3 be satisfied.

In addition, as a method of digitizing the intensity of the diffraction line in the direction perpendicular to the surface of the tool body from the electron diffraction pattern, there is a method of converting a diffraction pattern received by a computer into a grayscale digital image and determining the diffraction intensities Ic and Ih from the grayscale values of each diffraction arc on a straight line drawn from the irradiation axis O of the electron beams to the direction perpendicular to the surface S of the tool body 10 on the electron diffraction pattern. Otherwise, an intensity profile in FIG. 5A is obtained as described above for each of the diffraction arc of the (200) plane and the diffraction arc of the (11-20) plane in the vicinity of the direction perpendicular to the surface S of the tool body 10, and the peak areas of the diffraction lines are respectively determined as Ic and Ih. At this time, photographing conditions such as a photographing time of the electron diffraction pattern need to be adjusted so that a portion of the diffraction ring is not saturated. The photographing conditions can be adjusted by the individual apparatus of the transmission electron microscope.

As described above, since the hard coating layer of this embodiment is formed of a fine structure with mixed phases of the crystal grains having the rock-salt crystal structure and the crystal grains having the wurtzite crystal structure, the wear resistance and the fracturing resistance of the hard coating layer are higher than those of the conventional. Furthermore, since the {200} planes of the cubic crystal grains are oriented so as to be perpendicular to the surface of the tool body, and the {11-20} planes of the hexagonal crystal grains are oriented so as to be perpendicular to the surface of the tool body, the anisotropy due to the crystal structure is relieved, and therefore fracturing resistance and wear resistance are enhanced.

(f) Lower Portion Layer and Upper Portion Layer of Hard Coating Layer:

As described above, it is preferable that the lower portion layer 12 be formed at the lower layer of the hard coating layer 11 or the upper portion layer 13 be formed at the upper layer of the hard coating layer 11. When a TiN layer is formed as the lower portion layer 12, the intensity of adhesion between the tool body 10 and the hard coating layer 11 is enhanced. In addition, when a wear-resistant layer such as (Ti,Al)N, Ti(C,N), or (Al,Ti)N is formed as the lower portion layer 12 or the upper portion layer 13, the wear resistance of the film is further enhanced. Furthermore, when the hard coating layer 11 is coated with TiN or CrN as the upper portion layer 13, the cutting resistance of the film is reduced, and therefore chipping of the film or the generation of cutting heat can be suppressed. In addition, it is preferable that the average layer thickness of the upper portion layer 13 be 0.1 μm to 0.3 μm, and the average layer thickness of the lower portion layer 12 be 0.5 μm to 1.5 μm. The above-described cutting performance can be further enhanced when the average layer thickness of the upper portion layer 13 and the lower portion layer 12 falls into this range.

Next, a method of vapor-depositing the above-described hard coating layer 11 on the surface of the tool body 10 will be described with reference to FIG. 1.

Figure 1:
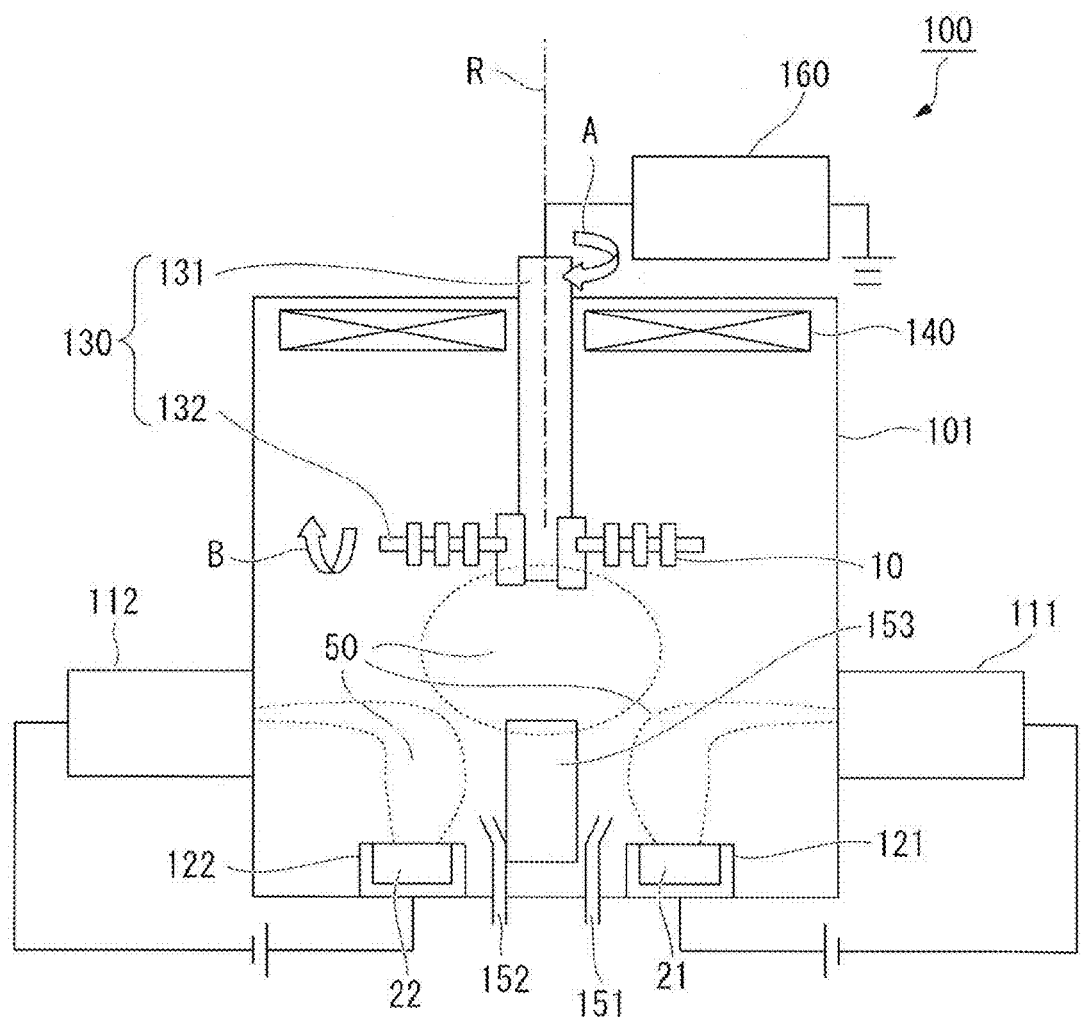
FIG. 1 is a schematic view of an ion plating apparatus having a pressure-gradient type Ar plasma gun, which is used for vapor-depositing a hard coating layer on the surface of a tool body.

FIG. 1 is a schematic view of an ion plating apparatus 100 used to vapor-deposit the hard coating layer 11 on the tool body 10. The ion plating apparatus 100 includes a housing 101, two plasma guns 111 and 112, two hearths 121 and 122, a tool body holder 130, a heater 140, an assist plasma gun 153, and a power source 160. The housing 101 forms a vapor deposition chamber for vapor deposition therein. At the bottom surface of the housing (chamber) 101, two reaction gas introduction ports 151 and 152 for introducing a reaction gas into the vapor deposition chamber and a discharge port (not shown) configured to discharge the gas after reactions from the housing are provided to allow the inside of the housing 101 and the outside to communicate with each other. The hearths 121 and 122 in which a vapor deposition material is put are respectively provided between the reaction gas introduction ports 151 and 152 and the side walls of the housing 101. The pressure-gradient type plasma guns 111 and 112 which irradiate the hearths 121 and 122 with plasmas 50 are provided on the side walls of the housing 101 above the hearths 121 and 122 (above the FIG. 1), and the hearth 121 and the plasma gun 111 are connected to a common power source and the hearth 122 and the plasma gun 112 are connected to a common power source. The assist plasma gun 153 which irradiates plasma separately from the plasma guns 111 and 112 is provided between the reaction gas introduction ports 151 and 152.

Furthermore, the tool body holder 130 is provided on the upper surface side of the housing. The tool body holder 130 includes a principal axis 131 electrically connected to the power source 160 that is provided outside the housing, and a holding portion 132 which extends in a direction perpendicular to the principal axis 131 and holds the tool body 10. The principal axis 131 is attached to the upper surface of the housing 101 so as to rotate around an axial line R which is perpendicular to the bottom surface of the housing 101 on which the hearths 121 and 122 are placed, and the holding portion 132 is attached to the principal axis 131 so as to rotate around an axial line (an axial line parallel to the bottom surface of the housing 101) perpendicular to the principal axis 131. In addition, the heater 140 which heats the tool body 10 is provided between the tool body holder 130 and the side walls of the housing 101. FIG. 1 shows an example in which a plurality of inserts as the tool body 10 are mounted on the tool body holder 130.

Next, a procedure of vapor-depositing the hard coating layer 11 on the surface of the tool body 10 by using the ion plating apparatus 100 will be described.

First, the tool body 10 in a dry state after cleaning is mounted on the holding portion 132 of the tool body holder 130, and Ti and Al as evaporation sources 21 and 22 are respectively installed on the hearths 121 and 122. Next, the inside of the vapor deposition chamber is allowed to enter a state in which vapor deposition can be started. Specifically, nitrogen gas as the reaction gas is introduced into the housing 101 (the vapor deposition chamber) from the reaction gas introduction ports 151 and 152 and the tool body 10 is heated to a predetermined temperature by the heater 140. At this time, the pressure inside the housing 101 is held at a constant level. Thereafter, while the flow rate of nitrogen gas introduced into the housing 101, the temperature of the tool body 10, and the pressure in the housing 101 are maintained, the principal axis 131 of the tool body holder 130 is rotated around the axis (arrow A) perpendicular to the bottom surface of the housing 101, and the holding portion 132 is rotated around the axis (arrow B) parallel to the bottom surface of the housing 101. In addition, a bias voltage is applied to the tool body 10 by the power source 160 via the tool body holder 130.

While the vapor deposition chamber is in this state, vapor deposition is started. First, discharge gas is supplied into the vapor deposition chamber from the plasma guns 111 and 112 and power is applied to the plasma guns 111 and 112 such that Ti in the hearth 121 and Al in the hearth 122 are respectively irradiated with the plasmas 50 from the plasma guns 111 and 112 so as to allow Ti and Al to be evaporated and ionized. At the same time, by the assist plasma gun 153 irradiating the plasma toward the upper side of the housing, $Ti^+$ ions and $Al^+$ ions are allowed to react with nitrogen gas to be vapor-deposited on the tool body 10. After the thickness of the hard coating layer 11 formed through vapor deposition becomes a desired thickness, the vapor deposition is ended.

In the above-described method, the bias voltage applied to the tool body 10 during the vapor deposition is a pulse bias voltage, and therefore a frequency of impacts between each type of ions and the tool body 10 varies. As a result, the hard coating layer vapor-deposited on the surface of the tool body 10 is formed so as to have a mixed phase structure including both cubic crystal grains with a rock-salt structure and hexagonal crystal grains with a wurtzite structure. In addition, by controlling the duty ratio of ON and OFF of the pulse bias voltage, the presence ratios of the cubic crystal grains and the hexagonal crystal grains can be controlled. Moreover, by controlling the duty ratio of ON and OFF of the pulse bias voltage, the cubic crystal grains and the hexagonal crystal grains can be oriented in a specific lower-order plane direction. Furthermore, by forming the hard coating layer using the ion plating apparatus 100 having the pressure-gradient type plasmas and the method which uses the apparatus, a hard coating layer with a relatively uniform layer thickness is easily formed.

(Second Embodiment)

A second embodiment of the coated tool of the present invention will be described with reference to the drawings.

As shown in FIG. 2A, the coated tool of this embodiment includes, as primary constituent elements, a tool body 10 made of a sintered tungsten carbide-based cemented carbide and a hard coating layer 11 which is vapor-deposited on the surface thereof. In this embodiment, the composition of the hard coating layer 11 is expressed by a composition formula of $(Al_xTi_{1-x})N (0.6 \leq x \leq 0.8)$, and the average layer thickness of the hard coating layer 11 is 0.5 μm to 5.0 μm.

In addition, in this embodiment, the compressive residual stress of the hard coating layer 11 is 8 GPa to 12 GPa. Since the other configurations are the same as those of the first embodiment, the description thereof will be omitted, and the different parts from those of the first embodiment will be described below.

The reason that the content x of Al with respect to the total amount of Al and Ti in $(Al_xTi_{1-x})N$ is 0.6 to 0.8 will be described. The crystal structure of $(Al_xTi_{1-x})N$ is transformed from a rock-salt crystal structure to a wurtzite crystal structure with x=0.6 to 0.8 as the boundary region. That is, in a region where $0.6 \leq x \leq 0.8$ is achieved, the rock-salt crystal structure and the wurtzite crystal structure can be allowed to coexist with each other. By switching the negative voltage of a pulse bias voltage applied to the tool body 10 between ON and OFF with a predetermined duty ratio as described above, the structure of the hard coating layer 11 which is a composite nitride film with a composition of $(Al_xTi_{1-x})N$ $(0.6 \leq x \leq 0.8)$ can be controlled to form a structure in which cubic crystal grains having the rock-salt crystal structure and hexagonal crystal grains having the wurtzite crystal structure coexist with each other, with good reproducibility. In addition, by setting the average layer thickness of the hard coating layer 11 to be 0.5 μm to 7.0 μm, chipping of films caused by an increase in the thickness is prevented, and an effect of exhibiting desired wear resistance can be obtained. Here, in this embodiment, since the content x of Al with respect to the total amount of Al and Ti satisfies 0.6≤x≤0.8 and the average layer thickness is 0.5 μm to 7.0 μm, the above-described action is more significantly exhibited than that of the first embodiment.

(a) Orientation of Cubic Crystal Grains and Hexagonal Crystal Grains:

In the hard coating layer 11, most of the {200} planes of the cubic crystal grains are oriented so as to be perpendicular to the surface of the tool body 10, and most of {11-20} planes of the hexagonal crystal grains are oriented so as to be perpendicular to the surface of the tool body 10. In the hard coating layer 11 like this, a unique crystal grain structure which is a fine structure and is oriented in a lower-order plane direction, is formed, and therefore further excellent wear resistance and fracturing resistance are exhibited.

Figure 6A:
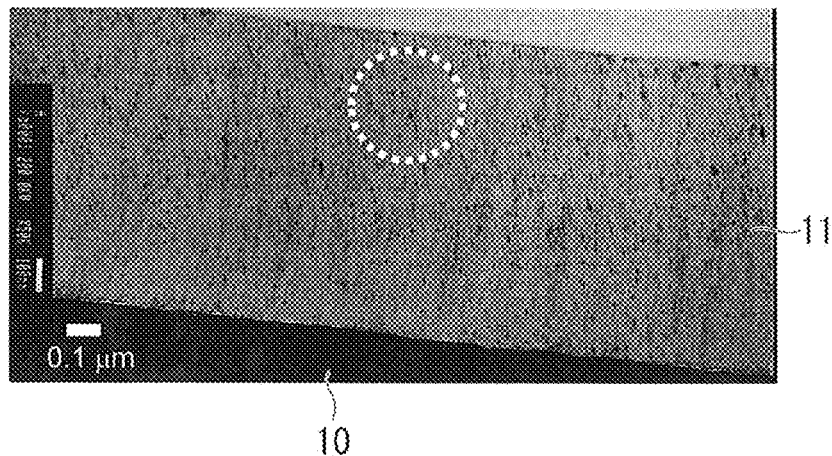
FIG. 6A is a transmission electron micrograph of the cross-section of the coated tool according to the embodiment of the present invention.

Specifically, in a region in which the content of Al with respect to the total amount of Al and Ti is 0.6 or higher, the hard coating layer 11 exhibits high wear resistance due to the effect of Al which enhances high temperature hardness and heat resistance. In addition to this, co-existence of crystal grains having the cubic rock-salt structure and crystal grains having the hexagonal wurtzite structure promotes formation of a finer crystal grain structure. As a result, the hard coating layer 11 exhibits excellent wear resistance. In addition, in a cross-section (see FIG. 6A) of the hard coating layer 11, which will be described later, it is preferable that the sum of the area occupied by the cubic crystal grains having the rock-salt structure and the area occupied by the hexagonal crystal grains having the wurtzite structure be 70% or higher of the area of the entire cross-section. Moreover, it is more preferable that the hard coating layer 11 be constituted only by the cubic crystal grains having the rock-salt structure, the hexagonal crystal grains having the wurtzite structure, and the grain boundaries between the grains. In this configuration, the above-described wear resistance and fracturing resistance are sufficiently exhibited. Hitherto, in a fine crystal grain structure with a mixed structure including both crystal grains with a rock-salt structure and crystal grains with a wurtzite structure, each of the crystal grains is randomly directed, and therefore many random grain boundaries are formed. Accordingly, the bonding force between the crystal grains is reduced and therefore the grains are likely to be separated due to impact. As a result, it is difficult to ensure sufficient performance to bear practical use in a hard coating layer for a tool. Contrary to this, in the hard coating layer 11 of this embodiment, since the crystal grains with the rock-salt structure and the crystal grains with the wurtzite structure have predetermined orientation, sufficient wear resistance and fracturing resistance for a hard coating layer for a tool can be ensured. That is, since most of the crystal grains have predetermined orientation, even in a case where crystal grains that are adjacent to each other have different crystal structures, anisotropy in the grain boundary between the crystal grains is relieved. In addition, regarding the predetermined orientation, the {200} planes of the cubic crystal grains and the {11-20} planes of the hexagonal crystal grains are oriented so as to be perpendicular to the surface of the tool body 10. Therefore, since the arrangement of atoms of the {10-10} plane perpendicular to the {11-20} plane among the crystal planes of the wurtzite structure is close to the arrangement of atoms of the {011} plane perpendicular to the {200} plane among the crystal planes of the rock-salt structure, many of grain boundaries having high coordination with low-energy are formed thereby increasing the bonding force between the crystal grains. As a result, the fracturing resistance of the entire film is enhanced. In addition, the ratio of the area of the cubic crystal grains of which the {200} planes are oriented at 15 degrees or lower from a direction perpendicular to the surface of the tool body 10 to the area occupied by the cubic crystal grains with the rock-salt structure in the cross-section of the hard coating layer 11, which will be described later, is preferably 50% to 100%, and is more preferably 80% to 100%. Similarly, the ratio of the area of the hexagonal crystal grains of which the {11-20} planes are oriented at 15 degrees or lower from the direction perpendicular to the surface of the tool body 10 to the area occupied by the hexagonal crystal grains with the wurtzite structure in the cross-section of the hard coating layer 11 is preferably 50% to 100%, and is more preferably 80% to 100%.

(b) Compressive Residual Stress of Hard Coating Layer

The compressive residual stress of the hard coating layer 11 is 8 GPa to 12 GPa. Accordingly, the compactness of the hard coating layer 11 can be improved. Therefore, even in a case where a crack occurs in the hard coating layer, the crack is less likely to advance, and the wear resistance and fracturing resistance can be enhanced. As a result, the tool can have a long life. The hard coating layer 11 of this embodiment has the above-described configuration, particularly the content x of Al with respect to the total amount of Al and Ti satisfies 0.6≤x≤0.8, and the average layer thickness is 0.5 μm to 7.0 μm. Therefore, even when the residual compressive stress of the hard coating layer 11 is set to be higher than that of a conventional hard coating layer, the hard coating layer 11 does not self-destruct. Specifically, while the limit of the residual compressive stress in a conventional hard coating layer is 5 GPa to 6 GPa, the residual compressive stress according to this embodiment may be 8 GPa to 12 GPa. When the compressive residual stress is lower than 8 GPa, the value thereof becomes low, and desired wear resistance cannot be obtained. On the other hand, when the compressive residual stress is higher than 12 GPa, the value thereof becomes too high, and this causes the self-destruction of the hard coating layer 11 even when the crystal grains have high bonding force therebetween. Accordingly, desired fracturing resistance cannot be obtained. Therefore, it is preferable that the compressive residual stress of the hard coating layer 11 be 8 GPa to 12 GPa.

The compressive residual stress of the hard coating layer 11 is imparted as follows. That is, by switching the negative voltage of the pulse bias voltage applied to the tool body 10 between ON and OFF with a predetermined duty ratio during vapor deposition as described above, the crystal structure of the hard coating layer 11 which is a composite nitride film with a composition of $(Al_xTi_{1-x})N(0.6≤x≤0.8)$ can be controlled to form a structure in which the cubic crystal grains with the rock-salt crystal structure and the hexagonal crystal grains with the wurtzite crystal structure coexist with each other. At this time, a negative DC (direct current) voltage is applied as a bias voltage simultaneously with the pulse bias voltage. That is, a negative voltage is applied even during the OFF period of the pulse bias voltage. Consequently, the bias voltage applied to the tool body 10 becomes a pulse bias voltage at which a high voltage and a low voltage are alternately applied. Accordingly, the vapor-deposited crystal grains are hit by Ti⁺ ions and Al⁺ ions, and the impact energy is accumulated in the vapor-deposited layer such that a compressive residual stress is imparted to the hard coating layer.

In addition, the residual compressive stress is measured according to a $\sin^2\psi$ method by X-ray diffraction measurement using CuKα X-rays. First, the cross-section of the hard coating layer is irradiated with X-rays from a plurality of angles $\psi$, and a diffraction line intensity distribution is measured. The angle $\psi$ is an angle between the cross-sectional direction and the X-ray irradiation direction. In addition, a diffraction angle which represents the peak of a diffraction line intensity for each of the obtained diffraction line intensity distributions, is measured. Next, the measured diffraction angle and $\sin^2\psi$ at that time are plotted on a graph in which the vertical axis represents the diffraction angle and the horizontal axis represents $\sin^2\psi$. A least squares approximate straight line of the plotted points is obtained, and the residual compressive stress can be calculated by multiplying the slope of this straight line by a stress constant.

The hard coating layer 11 according to this embodiment can be vapor-deposited by using the apparatus showed in FIG. 1. The vapor deposition procedure is the same as that of the first embodiment and is different therefrom in that the voltage applied to the tool body 10 by the power source 160 via the tool body holder 130 is the pulse bias voltage and the DC bias voltage, that is, a pulse voltage of a high negative voltage and a low negative voltage is applied. Accordingly, the hard coating layer 11 vapor-deposited on the surface of the tool body 10 is formed so as to have a mixed structure including both the cubic crystal grains with the rock-salt structure and the hexagonal crystal grains with the wurtzite structure, and a compressive residual stress can be imparted to the hard coating layer 11. In addition, by controlling the duty ratio of the pulse bias voltage, the presence ratios of the cubic crystal grains and the hexagonal crystal grains can be controlled. Moreover, by controlling the duty ratio of the pulse bias voltage, the cubic crystal grains and the hexagonal crystal grains can be oriented in a specific lower-order plane direction.

In addition, the technical scope of the present invention is not limited to the above-described embodiments, and various modifications can be made without departing from the spirit of the present invention.

Next, the coated tool of the present invention will be described in detail with reference to Examples.

EXAMPLE 1

As raw material powders, a WC powder, a TiC powder, a ZrC powder, a VC powder, a TaC powder, a NbC powder, a Cr₃C₂ powder, a TiN powder, and a Co powder each having an average grain size of 1 μm to 3 μm were prepared, and the raw material powders were blended to blending compositions shown in Table 1, and were wet-mixed by a ball mill for 72 hours, and were dried. Thereafter, the mixture of the raw material powders after being dried was press-formed into a compact under a pressure of 100 MPa, and the compact was held in vacuum at a pressure of 6 Pa under the condition of a temperature of 1400° C. for 1 hour so as to be sintered. After the sintering, a cutting edge portion was subjected to honing with a radius R of 0.03 mm, thereby forming tool bodies A to E made of tungsten carbide-based cemented carbide (WC) with insert shapes specified in ISO standard CNMG 120408.

Thereafter, each of the tool bodies A to E was subjected to ultrasonic cleaning in acetone and was thereafter dried. The tool bodies A to E were mounted on the tool body holder 130 of the ion plating apparatus 100 having a pressure-gradient type argon (Ar) plasma gun which is a type of physical vapor deposition apparatus shown in the schematic view of FIG. 1 described above, and hard coating layers were vapor-deposited under the following conditions.

Tool body temperature: 400° C. to 430° C.
Evaporation source 21: titanium (Ti)
Discharge power of the plasma gun 111 for the evaporation source 21: 8 kW to 9 kW
Evaporation source 22: aluminum (Al)
Discharge power of the plasma gun 112 for the evaporation source 22: 9 kW to 11 kW
Reaction gas flowing into the vapor deposition chamber from the reaction gas introduction ports 151 and 152: nitrogen (N₂) gas
Flow rate of nitrogen gas: 100 sccm
Discharge gas for the plasma guns: argon (Ar) gas
Flow rate of argon gas for the plasma guns: 35 sccm
Bias voltage applied to the tool body: a pulse voltage with a cycle of 100 μsec (a pulse voltage at which an ON period during which a voltage of −90 V or −80 V is applied for 98 μsec and an OFF period during which a voltage is not applied for 2 μsec are repeated)
Discharge power of the assist plasma gun 153: 2 kW
Vapor deposition time: 40 min to 280 min Specifically, hard coating layers with predetermined target layer thicknesses shown in Table 3 were formed under the formation conditions shown in Table 2, and invention inserts a1 to a8 were produced as surface-coated cutting tools according to this example. In addition, in Table 2, regarding the bias voltage, the voltage (V) during the ON period and the application time (μsec) for a cycle (100 μsec) are shown.

In addition, for the purpose of comparison, comparative inserts a1 to a8 were formed. The tool bodies A to E which were the same as the invention inserts a1 to a8 were subjected to ultrasonic cleaning in acetone and were dried. Similarly to the invention inserts a1 to a8, the tool bodies A to E were mounted on the tool body holder 130 of the ion plating apparatus 100 having the pressure-gradient type Ar plasma gun which is a type of physical vapor deposition apparatus shown in the schematic view of FIG. 1, and hard coating layers were allowed to be vapor-deposited under the following conditions.

Tool body temperature: 400° C. to 430° C.
Evaporation source 21: titanium (Ti)
Discharge power of the plasma gun 111 for the evaporation source 21: 8 kW to 9 kW
Evaporation source 22: aluminum (Al)
Discharge power of the plasma gun 112 for the evaporation source 22: 9 kW to 11 kW
Reaction gas flowing into the vapor deposition chamber from the reaction gas introduction ports 151 and 152: nitrogen (N₂) gas
Flow rate of nitrogen gas: 100 sccm
Discharge gas for the plasma guns: argon (Ar) gas
Flow rate of argon gas for the plasma guns: 35 sccm
Bias voltage applied to the tool body: a DC voltage of −10 V to −20 V
Discharge power of the assist plasma gun 153: no assist plasma gun was used
Vapor deposition time: vapor deposition was performed until the target layer thickness was achieved (refer to Table 5)

Specifically, hard coating layers with predetermined target layer thicknesses shown in Table 5 were formed under the formation conditions shown in Table 4, and comparative inserts a1 to a8 were produced as coated tools for comparison.

In addition, before and/or after above-mentioned forming the hard coating layer, an upper portion layer with an average layer thickness of 0.1 μm to 0.3 μm or a lower portion layer with an average layer thickness of 0.5 μm to 1.5 μm, which are made of any of TiN, (Ti,Al)N, Ti(C,N), (Al,Cr)N, and CrN, were formed by using a typical physical vapor deposition method, thereby producing each of invention inserts a9 to a14 and comparative inserts a9 to a12 shown in Tables 3 and 5. In addition, a typical physical vapor deposition method is a physical vapor deposition method generally used for coating a tool, and arc ion plating is employed as an example. Arc ion plating is a method of allowing metal disposed in the vapor deposition chamber to be partially subjected to arc discharge and therefore allowing the metal to be scattered in an ionized state and be deposited on a target.

Next, in a state where various inserts described above were screwed to the tip end portion of an insert holder of tool steel by a fixing jig, a dry intermittent high-speed cutting test was conducted on the invention inserts a1 to a14 and the comparative inserts a1 to a12 under the following cutting conditions A to C. The dry intermittent high-speed cutting test is a test of cutting, in the circumferential direction, a round bar in which a plurality of grooves along in the axial direction (longitudinal direction) are formed on the surface at equal intervals in the circumferential direction while feeding the round bar in the axial direction without using a lubricant. In addition, the test was performed by setting the cutting speed under each of the conditions to be higher than a typical cutting speed. The typical cutting speed is referred to as a cutting speed at which an optimal efficiency (generally, such as the number of components cut within the tool life) is obtained using a conventional coated insert. When cutting is performed at a speed higher than the above speed, the life of the tool is extremely reduced, and the work efficiency is reduced.

(Cutting Condition A: Dry Intermittent High-Speed Cutting Test of Stainless Steel)
  Workpiece: a round bar with two longitudinal grooves in the longitudinal direction formed at equal intervals of JIS-SUS 316 standard (corresponding to ISO TR 15510-26)
  Cutting speed: 180 m/min. (typical cutting speed: 150 m/min.)
  Cutting depth: 1.5 mm
  Feed rate: 0.25 mm/rev.
  Cutting time: 5 minutes (Cutting Condition B: Dry Intermittent High-Speed Cutting Test of Carbon Steel)
  Workpiece: a round bar with four longitudinal grooves in the longitudinal direction formed at equal intervals of JIS-S50C standard (corresponding to ISO 683-1-C50, C50E4, or C50M2)
  Cutting speed: 240 m/min. (typical cutting speed: 220 m/min.)
  Cutting depth: 2.0 mm
  Feed rate: 0.25 mm/rev.
  Cutting time: 5 minutes (Cutting Condition C: Dry Intermittent High-Speed Cutting Test of Alloy Steel)
  Workpiece: a round bar with six longitudinal grooves in the longitudinal direction formed at equal intervals of JIS-SCM440 standard (corresponding to ISO 683/1-42CrMo4 or ISO 683/1-42CrMoS4)
  Cutting speed: 250 m/min. (typical cutting speed: 200 m/min.)
  Cutting depth: 1.5 mm
  Feed rate: 0.25 mm/rev.
  Cutting time: 5 minutes Under such conditions, the dry intermittent high-speed cutting test was performed on the invention inserts a1 to a14 and the comparative inserts a1 to a12. The width of flank wear in the film thickness direction of the cutting edge at this time was measured. The measurement results are shown in Table 6. In addition, in the comparative inserts a1 to a12, significant wear had occurred due to chipping, fracturing, or the like of films. Regarding these inserts, a cutting life time (min:sec) until the maximum wear width exceeds 0.25 mm is written in Table 6 and is provided with an asterisk.

TABLE 1

| Type | | Blending composition (mass %) | | | | | | | | |
|---|---|---|---|---|---|---|---|---|---|---|
| | | Co | TiC | ZrC | VC | TaC | NbC | $Cr_3C_2$ | TiN | WC |
| Tool body | A | 6.5 | 1.5 | — | — | — | 2.9 | 0.2 | 1.5 | Remainder |
| | B | 7.6 | 2.6 | — | — | 4.0 | 0.5 | — | 1.1 | Remainder |
| | C | 8.4 | — | 0.6 | — | 0.5 | 2.5 | 0.2 | 2 | Remainder |
| | D | 6.6 | — | — | — | 1.7 | 0.2 | — | — | Remainder |
| | E | 10 | — | — | 0.2 | — | — | 0.3 | — | Remainder |

TABLE 2

| | | Ion plating conditions using pressure-gradient type Ar plasma gun | | | | | | | | |
|---|---|---|---|---|---|---|---|---|---|---|
| | | | | | | | | Pulse configuration for one cycle (one cycle is 100 μsec) | | |
| | Formation symbol | Plasma gun discharge power (kW) for metal Ti | Plasma gun discharge power (kW) for metal Al | Reaction gas ($N_2$) flow rate (sccm) | Discharge gas (Ar) flow rate (sccm) | Pressure in furnace (Pa) | Bias voltage (V) | Application time (μsec) | Discharge power (kW) of assist plasma gun | Tool body temperature (° C.) |
| Invention insert | 1 | 9 | 9 | 100 | 35 | 0.2 | −80 | 98 | 2 | 420 |
| | 2 | 9 | 9 | 100 | 35 | 0.2 | −90 | 98 | 2 | 420 |

TABLE 2-continued

Ion plating conditions using pressure-gradient type Ar plasma gun

| Formation symbol | Plasma gun discharge power (kW) for metal Ti | Plasma gun discharge power (kW) for metal Al | Reaction gas (N₂) flow rate (sccm) | Discharge gas (Ar) flow rate (sccm) | Pressure in furnace (Pa) | Pulse configuration for one cycle (one cycle is 100 μsec) | | Discharge power (kW) of assist plasma gun | Tool body temperature (° C.) |
|---|---|---|---|---|---|---|---|---|---|
| | | | | | | Bias voltage (V) | Application time (μsec) | | |
| 3 | 9 | 10 | 100 | 35 | 0.1 | −90 | 98 | 2 | 450 |
| 4 | 9 | 10 | 100 | 35 | 0.1 | −90 | 98 | 2 | 420 |
| 5 | 8 | 10 | 100 | 35 | 0.1 | −90 | 98 | 2 | 430 |
| 6 | 8 | 10 | 100 | 35 | 0.1 | −90 | 98 | 2 | 430 |
| 7 | 8 | 12 | 100 | 35 | 0.08 | −90 | 98 | 2 | 430 |
| 8 | 8 | 12 | 100 | 35 | 0.08 | −90 | 98 | 2 | 430 |

TABLE 3

| Type | | Tool body symbol | Lower portion layer | | | Hard coating layer | | | | | |
|---|---|---|---|---|---|---|---|---|---|---|---|
| | | | Film type | Target layer thickness (μm) | Formation condition | Content x of Al in $(Al_xTi_{1-x})N$ | Average grain size (nm) | Average aspect ratio | Angular width (degrees) of diffraction arc of (200) of rock-salt structure | Angle φ (degrees) between diffraction arc center of (200) of rock-salt structure and tool body surface |
| Invention insert | a1 | A | — | — | 1 | 0.50 | 48 | 3.1* | 24 | 86 |
| | a2 | B | — | — | 2 | 0.53 | 42 | 2.2 | 23 | 85 |
| | a3 | C | — | — | 3 | 0.62 | 23 | 1.8 | 32 | 85 |
| | a4 | D | — | — | 4 | 0.60 | 25 | 1.7 | 33 | 86 |
| | a5 | E | — | — | 5 | 0.64 | 19 | 1.5 | 42 | 88 |
| | a6 | A | — | — | 6 | 0.65 | 16 | 1.4 | 46 | 85 |
| | a7 | B | — | — | 7 | 0.72 | 7 | 1.1 | 55 | 87 |
| | a8 | C | — | — | 8 | 0.76 | 8 | 1.1 | 54 | 86 |
| | a9 | D | (Ti, Al)N | 0.8 | 2 | 0.54 | 40 | 2.2 | 23 | 88 |
| | a10 | E | (Al, Cr)N | 0.5 | 3 | 0.62 | 25 | 1.8 | 32 | 87 |
| | a11 | A | TiN | 1.5 | 4 | 0.60 | 24 | 1.7 | 33 | 86 |
| | a12 | B | (Ti, Al)N | 0.8 | 5 | 0.64 | 20 | 1.5 | 42 | 88 |
| | a13 | C | Ti(C, N) | 0.8 | 6 | 0.65 | 15 | 1.4 | 46 | 86 |
| | a14 | D | (Al, Cr)N | 1.1 | 7 | 0.71 | 9 | 1.1 | 55 | 87 |

| Type | | Hard coating layer | | | | | Upper portion layer | |
|---|---|---|---|---|---|---|---|---|
| | | Angular width (degrees) of diffraction arc of (11-20) of wurtzite structure | Angle φ (degrees) between diffraction arc center of (11-20) of wurtzite structure and tool body surface | Ic/(Ic + Ih) | Residual compressive stress (GPa) | Target layer thickness (μm) | Film type | Target layer thickness (μm) |
| Invention insert | a1 | 26 | 85 | 0.9** | 5 | 2.0 | — | — |
| | a2 | 20 | 85 | 0.8 | 4 | 3.0 | — | — |
| | a3 | 28 | 89 | 0.8 | 5 | 3.5 | — | — |
| | a4 | 32 | 87 | 0.7 | 6 | 3.0 | — | — |
| | a5 | 40 | 89 | 0.7 | 5 | 3.5 | — | — |
| | a6 | 44 | 85 | 0.3 | 7 | 7.0 | — | — |
| | a7 | 52 | 86 | 0.3 | 5 | 4.0 | — | — |
| | a8 | 53 | 88 | 0.2** | 5 | 3.5 | — | — |
| | a9 | 25 | 84 | 0.8 | 5 | 2.0 | — | — |
| | a10 | 30 | 86 | 0.8 | 6 | 1.2 | — | — |

TABLE 3-continued

| | | | | | | | |
|---|---|---|---|---|---|---|---|
| a11 | 30 | 85 | 0.7 | 6 | 1.0 | CrN | 0.2 |
| a12 | 40 | 87 | 0.7 | 4 | 0.5 | TiN | 0.3 |
| a13 | 45 | 85 | 0.3 | 5 | 1.5 | TiN | 0.2 |
| a14 | 55 | 85 | 0.3 | 6 | 1.2 | (Ti, Al)N | 0.1 |

TABLE 4

Ion plating conditions using pressure-gradient type Ar plasma gun

| | Formation symbol | Plasma gun discharge power (kW) for metal Ti | Plasma gun discharge power (kW) for metal Al | Reaction gas (N$_2$) flow rate (sccm) | Discharge gas (Ar) flow rate (sccm) | Pressure in furnace (Pa) | Bias voltage (V) | Pulse configuration for one cycle (one cycle is 100 μsec) Application time (μsec) | Tool body temperature (° C.) |
|---|---|---|---|---|---|---|---|---|---|
| Comparative insert | 1 | 9 | 9 | 100 | 35 | 0.2 | −10 | DC | 400 |
| | 2 | 9 | 9 | 100 | 35 | 0.2 | −10 | DC | 420 |
| | 3 | 9 | 10 | 100 | 35 | 0.1 | −10 | DC | 450 |
| | 4 | 9 | 10 | 100 | 35 | 0.1 | −10 | DC | 420 |
| | 5 | 8 | 10 | 100 | 35 | 0.1 | −20 | DC | 430 |
| | 6 | 8 | 10 | 100 | 35 | 0.1 | −20 | DC | 430 |
| | 7 | 8 | 12 | 100 | 35 | 0.08 | −20 | DC | 430 |
| | 8 | 8 | 12 | 100 | 35 | 0.08 | −20 | DC | 430 |

TABLE 5

| | | Lower portion layer | | | Hard coating layer | | | | | | | Upper portion layer | | |
|---|---|---|---|---|---|---|---|---|---|---|---|---|---|---|
| Type | Tool body symbol | Film type | Target layer thickness (μm) | Formation condition | Content x of Al in (Al$_x$Ti$_{1-x}$)N | Average grain size (nm) | Average aspect ratio | Angular width (degrees) of diffraction arc of (200) of rock-salt structure | Angle φ (degrees) between diffraction arc center of (200) of rock-salt structure and tool body surface | Angular width (degrees) of diffraction arc of (11-20) of wurtzite structure | Angle φ (degrees) between diffraction arc center of (11-20) of wurtzite structure and tool body surface | Ic/(Ic + Ih) | Film type | Target layer thickness (μm) |
| Comparative insert a1 | A | — | — | 1 | 0.50 | 100 | 15 | Entire circumference | — | No arc | — | 1 | — | 2.0 |
| a2 | B | — | — | 2 | 0.53 | 84 | 18 | Entire circumference | — | No arc | — | 1 | — | 3.0 |
| a3 | C | — | — | 3 | 0.62 | 70 | 15 | Entire circumference | — | No arc | — | 1 | — | 3.5 |
| a4 | D | — | — | 4 | 0.60 | 80 | 14 | Entire circumference | — | No arc | — | 1 | — | 3.0 |
| a5 | E | — | — | 5 | 0.64 | 25 | 15 | Entire circumference | — | Entire circumference | — | 0.5 | — | 3.5 |
| a6 | B | — | — | 6 | 0.65 | 35 | 14 | Entire circumference | — | Entire circumference | — | 0.5 | — | 7.0 |
| a7 | C | — | — | 7 | 0.72 | 24 | 14 | No arc | — | Entire circumference | — | 0.3 | — | 4.0 |
| a8 | D | — | — | 8 | 0.76 | 26 | 15 | No arc | — | Entire circumference | — | 0 | — | 3.5 |
| a9 | E | TiN | 1.5 | 2 | 0.54 | 105 | 16 | Entire circumference | — | No arc | — | 1 | CrN | 2.0 |
| a10 | A | (Ti, Al)N | 0.8 | 3 | 0.62 | 26 | 16 | Entire circumference | — | No arc | — | 1 | Ti(C, N) | 1.2 |
| a11 | B | Ti(C, N) | 0.8 | 4 | 0.60 | 26 | 12 | Entire circumference | — | No arc | — | 1 | (Al, Cr)N | 1.0 |
| a12 | C | (Al, Cr)N | 1.1 | 5 | 0.64 | 27 | 15 | Entire circumference | — | Entire circumference | — | 0.2 | (Ti, Al)N | 0.5 |

TABLE 6

| | | Flank wear width (mm) | | | | Flank wear width (mm) or cutting life time (min) | | | |
|---|---|---|---|---|---|---|---|---|---|
| Type | | Cutting condition A | Cutting condition B | Cutting condition C | Type | | Cutting condition A | Cutting condition B | Cutting condition C | Primary cause for shorten life |
| Invention insert | a1 | 0.20 | 0.19 | 0.20 | Comparative insert | a1 | 2:00* | 2:30* | 2:00* | Wear amount |
| | a2 | 0.19 | 0.17 | 0.18 | | a2 | 2:30* | 2:30* | 2:30* | Wear amount |
| | a3 | 0.16 | 0.14 | 0.15 | | a3 | 2:30* | 3:00* | 2:30* | Chipping |
| | a4 | 0.16 | 0.14 | 0.15 | | a4 | 3:00* | 3:00* | 3:00* | Chipping |
| | a5 | 0.14 | 0.12 | 0.13 | | a5 | 3:30* | 3:30* | 3:00* | Chipping |
| | a6 | 0.15 | 0.12 | 0.14 | | a6 | 3:30* | 4:00* | 3:30* | Wear amount |
| | a7 | 0.19 | 0.18 | 0.15 | | a7 | 2:00* | 2:30* | 2:30* | Wear amount |
| | a8 | 0.18 | 0.16 | 0.14 | | a8 | 2:30* | 2:30* | 3:00* | Wear amount |
| | a9 | 0.12 | 0.10 | 0.11 | | a9 | 0.25 | 0.24 | 0.24 | Normal wear |
| | a10 | 0.12 | 0.11 | 0.10 | | a10 | 0.24 | 0.23 | 0.22 | Normal wear |
| | a11 | 0.10 | 0.09 | 0.10 | | a11 | 0.24 | 0.24 | 0.23 | Normal wear |
| | a12 | 0.12 | 0.10 | 0.11 | | a12 | 4:30* | 0.25 | 4:30* | High wear amount |
| | a13 | 0.13 | 0.12 | 0.12 | | | | | | |
| | a14 | 0.14 | 0.12 | 0.13 | | | | | | |

The compositions of the hard coating layers of the invention inserts a1 to a14 and the comparative inserts a1 to a12 obtained as a result were measured by energy-dispersive X-ray spectroscopy using the transmission electron microscope, and all of the results showed substantially the same compositions as the target compositions (target content x of Al with respect to the total amount of Al and Ti) shown in Tables 3 and 5.

Moreover, thin pieces were cut from the (Al,Ti)N layers included in the hard coating layers of the invention inserts a1 to a14 and the comparative inserts a1 to a12 by focused ion beam processing. The thin piece is a thin piece which includes the tool body and the hard coating layer from the flank face of the tool and has dimensions a width of 100 μm, a height of 300 μm, and a thickness of 0.2 μm. In addition, a direction parallel to the surface of the tool body is referred to as width, and a direction perpendicular to the surface of the tool body (film thickness direction) is referred to as height. In the thin pieces, a visual field which was set to include all of the thickness region of the hard coating layer, with a width of 10 μm, and a height that was twice the average layer thickness of the hard coating layer was observed by the transmission electron microscope, and thereby the crystal structure of crystal grains was determined from the electron diffraction pattern. As a result, it was confirmed that the invention inserts a1 to a14 had a mixed structure with both cubic crystal grains having a rock-salt structure with {200} orientation in the direction perpendicular to the surface of the tool body and hexagonal crystal grains having a wurtzite structure with {11-20} orientation in the same manner.

In addition, the layer thicknesses of the hard coating layers of the invention inserts a1 to a14 and the comparative inserts a1 to a12 were measured by using a scanning electron microscope (a magnification of 5000 times), and the average layer thickness was obtained by measuring and averaging the layer thicknesses of five points in an observation visual field. All of the results showed substantially the same average layer thicknesses as the target layer thicknesses shown in Tables 3 and 5.

In addition, the cross-sections of the hard coating layers of the invention inserts a1 to a14 and the comparative inserts a1 to a12 were observed by a transmission electron microscope (the magnification was set to an appropriate value in a range of from 200,000 times to 1,000,000 times), and the average grain size and the average aspect ratio were measured. The aspect ratio was defined as the value obtained by dividing the major axis with the minor axis. The major and minor axes of each crystal grain existing in an area of the average layer thickness×5 μm in an observation visual field were measured. The area was defined by: a line segment, which had an arbitrary-set start point on the tool body surface in the cross-sectional structure observation visual field, was in the thickness direction, and had the length equals to the average layer thickness; and another line segment, which had the same start point as the former line segment; was in the direction perpendicular to the thickness direction, and had the length of 5 μm. A line segment representing the maximum length of a crystal grain was measured as a major axis (grain length), and a line segment representing the maximum width of the crystal grain in a direction perpendicular to the major axis was measured as a minor axis (grain width). In addition, the average value of the aspect ratios of the individual crystal grains in the area of the average layer thickness×5 μm in the observation visual field was obtained as an average aspect ratio. In addition, the average value of the major axis and the minor axis of the individual grains was obtained as a crystal grain size of the grain, and the average value of the crystal grain sizes of the individual crystal grains in the area of the average layer thickness×5 μm in the observation visual field was obtained as an average grain size. The results are shown in Tables 3 and 5. In addition, in Table 3, results having an average aspect ratio of 3 or lower are provided with an asterisk.

Furthermore, an electron diffraction pattern was observed in a state where electron beams having a spot diameter corresponding to the layer thickness of the hard coating layer were irradiated in the cross-sectional direction of the hard coating layer. FIGS. 3B, 4, and 5B are examples. As a result, in the invention inserts a1 to a14, portions of diffraction rings derived from the rock-salt structure and diffraction rings or portions (arcs) thereof derived from the wurtzite structure were observed, and it was confirmed that both of the diffraction arc of the (200) plane of the rock-salt structure and the diffraction arc of the (11-20) plane of the wurtzite structure were not complete circles and were arcs. Regarding each of the diffraction arc of the (200) plane of the rock-salt structure and the diffraction arc of the (11-20) plane of the wurtzite structure, the angular width θ (central angle) of the arc was measured from the electron diffraction pattern. In addition, an angle φ(here, φ≤90°) between a straight line (a bisector of the angular width θ) connecting the radius center of the diffraction arc (the irradiation axis O of the electron beams) with the midpoint of the opening angle of the arc and the surface of the tool body, was measured. The results are shown in Table 3.

Electron diffraction patterns of the comparative inserts a1 to a12 are as shown in Table 5. From the electron diffraction patterns, the diffraction pattern of the (200) plane of the rock-salt structure and the diffraction pattern of the (11-20) plane of the wurtzite structure were observed as diffraction rings, no diffraction pattern was observed, and diffraction patterns observed as arcs were not present. Therefore, the angular width θ and the angle φ could not be measured.

Moreover, the intensity profiles of the diffraction pattern of the (200) plane derived from the rock-salt structure and the diffraction pattern of the (11-20) plane derived from the wurtzite structure in the direction perpendicular to the surface of the tool body, were calculated from the electron diffraction pattern, and Ic/(Ic+Ih) was calculated, wherein the peak area of the (200) diffraction line of the rock-salt structure was referred to as an intensity Ic and the peak area of the (11-20) diffraction line of the wurtzite structure was referred to as an intensity Ih. The results are shown in Tables 3 and 5. In Table 3, results in which the value of Ic/(Ic+Ih) was not included in a range of 0.3 to 0.8 are provided with two asterisks.

According to Table 3, in the invention inserts a1 to a14, the composition of the hard coating layer was $(Ti_{1-x}Al_x)N$ (0.5≤x≤0.8), and the average grain size of the crystal grains was 5 nm to 50 nm. In addition, in the electron diffraction patterns (see FIG. 3B), since portions of diffraction rings derived from the rock-salt structure and diffraction rings or portions thereof derived from the wurtzite structure were observed, it could be seen that there were mixed structures including both the cubic crystal grains with the rock-salt structure and the hexagonal crystal grains with the wurtzite structure. In addition, since the angular widths θ of both of the diffraction arc of the (200) plane of the rock-salt structure and the diffraction arc of the (11-20) plane of the wurtzite structure were 60 degrees or lower, and the angles φ thereof were 75 degrees of higher and 90 degrees or lower, it could be seen that the {200} planes of the cubic crystal grains and the {11-20} planes of the hexagonal crystal grains were oriented so as to be perpendicular to the surface of the tool body. Furthermore, it could be seen from Table 6 that in the invention inserts a1 to a14, the wear amount during cutting was small compared to the comparative inserts a1 to a12. That is, from the results shown in Tables 3 and 6, in the invention inserts a1 to a14, over the entire hard coating layer or the entire film, excellent fracturing resistance was provided, and excellent wear resistance was exhibited. Accordingly, it was apparent that excellent tool characteristics were exhibited over a long period of time without the occurrence of detachment, fracturing, and chipping.

On the other hand, according to Table 5, in the comparative inserts a1 to a12, the composition of the hard coating layer was $(Ti_{1-x}Al_x)N$(0.5≤x≤0.8). In addition, the average grain size of the crystal grains of the comparative inserts a4 to a8 and a10 to a12 was 5 nm to 50 nm. However, the hard coating layers of the comparative inserts a1 to a4 and a7 to a11 did not have mixed structures including both the cubic crystal grains with the rock-salt structure and the hexagonal crystal grains with the wurtzite structure, and the hard coating layer was formed of only one of the cubic crystal grains with the rock-salt structure and the hexagonal crystal grains with the wurtzite structure. In addition, although the hard coating layers of the comparative inserts a5, a6, and a12 had mixed structures including both the cubic crystal grains with the rock-salt structure and the hexagonal crystal grains with the wurtzite structure, the {200} planes of the cubic crystal grains and the {11-20} planes of the hexagonal crystal grains were not oriented so as to be perpendicular to the surface of the tool body. Therefore, in the comparative inserts a1 to a12, over the entire hard coating layer and the entire film, fracturing resistance and wear resistance were deteriorated, and detachment, fracturing, and chipping had occurred. Accordingly, it was apparent that the comparative inserts a1 to a12 reached the end of their service lives within a relatively short time.

According to Tables 3 and 6, the wear widths after the dry intermittent high-speed cutting test of the invention inserts a9 to a14 having the lower portion layers were formed were smaller than the wear widths of the invention inserts a1 to a8 having no lower portion layers. From this, it can be seen that cutting performance is enhanced when the lower portion layer is formed. Furthermore, the invention insert a11 having the lower portion layer formed of TiN and the upper portion layer formed of CrN, exhibited the smallest wear width and high cutting performance in any cutting conditions. In the invention inserts a10 and a14 having the lower portion layer formed of (Al,Cr)N, the invention insert a10 without the upper portion layer had a smaller wear width than that of the invention insert a14 having the upper portion layer and exhibited higher cutting performance. In the invention inserts a9 and a12 having the lower portion layer formed of (Ti,Al)N, the wear width of the invention insert a12 having the upper portion layer had the same value as that of the wear width of the invention insert a9 without the upper portion layer.

In the invention insert a1 formed of crystal grains with an average aspect ratio of higher than 3, the wear width after the dry intermittent high-speed cutting test was smaller than those of the comparative inserts a1 to a12 but was greater than those of the invention inserts a2 to a14 with an average aspect ratio of lower than 3. In addition, in the invention inserts a2 to a8 which did not have the lower portion layers and had an average aspect ratio of 3 or lower, the invention inserts a3 to a6 with an average aspect ratio of 1.4 to 1.8 had the wear widths of less than 0.18 mm, which were smaller than those of the other invention inserts a2, a7, and a8, and exhibited better cutting performance than those of the other invention inserts a2, a7, and a8.

In addition, the average aspect ratios of the comparative inserts a1 to a12 were much higher than 3. This is because the bias voltage applied to the tool body during the production of the comparative inserts a1 to a12 was not a pulse bias voltage but a constant DC voltage.

In the invention insert a1 in which the value of Ic/(Ic+Ih) is higher than 0.8, the wear width after the dry intermittent high-speed cutting test was higher than those of the other invention inserts. In addition, in the invention insert a8 in which the value of Ic/(Ic+Ih) is lower than 0.3, the wear width after the dry intermittent high-speed cutting test performed under the cutting condition A was relatively increased.

EXAMPLE 2

First, tool bodies A to E were formed in the same manner as in Example 1. Specifically, as raw material powders, a WC powder, a TiC powder, a ZrC powder, a VC powder, a TaC powder, a NbC powder, a $Cr_3C_2$ powder, a TiN powder, and a Co powder each having an average grain size of 1 μm to 3 μm were prepared, and the raw material powders were blended to blending compositions shown in Table 1, were wet-mixed by a ball mill for 72 hours, and were dried. Thereafter, the mixture of the raw material powders after being dried was press-formed into a compact under a pressure of 100 MPa, and the compact was held in vacuum at a pressure of 6 Pa under the condition of a temperature of 1400° C. for 1 hour so as to be sintered. After the sintering, a cutting edge portion was subjected to honing with a radius R of 0.03 mm, thereby forming the tool bodies A to E made of tungsten carbide-based cemented carbide with insert shapes specified in ISO standard CNMG 120408.

Thereafter, each of the tool bodies A to E was subjected to ultrasonic cleaning in acetone and was thereafter dried. The tool bodies A to E were mounted on the tool body holder 130 of the ion plating apparatus 100 having a pressure-gradient type argon (Ar) plasma gun which is a type of physical vapor deposition apparatus shown in the schematic view of FIG. 1 described above, and hard coating layers were vapor-deposited under the following conditions.

Tool body temperature: 420° C. to 450° C.
Evaporation source 21: titanium (Ti)
Discharge power of the plasma gun 111 for the evaporation source 21: 8 kW to 9 kW
Evaporation source 22: aluminum (Al)
Discharge power of the plasma gun 112 for the evaporation source 22: 9 kW to 12 kW
Reaction gas flowing into the vapor deposition chamber from the reaction gas introduction ports 151 and 152: nitrogen ($N_2$) gas
Flow rate of nitrogen gas: 100 sccm
Discharge gas for the plasma guns: argon (Ar) gas
Flow rate of argon gas for the plasma guns: 35 sccm
Bias voltage applied to the tool body: a pulse voltage with a cycle of 100 μsec (a pulse voltage at which an ON period during which a voltage of −90 V or −80 V is applied for 98 μsec and an OFF period during which a voltage is not applied for 2 μsec are repeated, and a DC bias voltage of −50 V or −60 V is applied during the OFF period)
Discharge power of the assist plasma gun 153: 2 kW
Vapor deposition time: 40 min to 280 min Specifically, hard coating layers with predetermined target layer thicknesses shown in Table 8 were formed under the formation conditions shown in Table 7, and invention inserts b1 to b8 were produced as surface-coated cutting tools according to this example. In addition, in Table 7, regarding the bias voltage, the voltage (V) during the ON period and the application time (μsec) for a cycle (100 μsec) are shown. In addition, the bias voltage applied to the tool body during the OFF period is a voltage applied during the OFF period (2 μsec) of the pulse voltage.

In addition, for the purpose of comparison, comparative inserts b1 to b8 were formed. The tool bodies A to E which were the same as the invention inserts b1 to b8 were subjected to ultrasonic cleaning in acetone, and were dried. Similarly to the invention inserts b1 to b8, the tool bodies A to E were mounted on the ion plating apparatus 100 which uses the pressure-gradient type Ar plasma gun which is a type of physical vapor deposition apparatus shown in the schematic view of FIG. 1, and hard coating layers were vapor-deposited under the following conditions.

Tool body temperature: 400° C. to 450° C.
Evaporation source 21: titanium (Ti)
Discharge power of the plasma gun 111 for the evaporation source 21: 8 kW to 9 kW
Evaporation source 22: aluminum (Al)
Discharge power of the plasma gun 112 for the evaporation source 22: 9 kW to 12 kW
Reaction gas of the reaction gas introduction ports 1 and 2: nitrogen ($N_2$) gas
Flow rate of nitrogen gas: 100 sccm
Discharge gas for the plasma guns: argon (Ar) gas
Flow rate of argon gas for the plasma guns: 35 sccm
Bias voltage applied to the tool body: a DC voltage of −10 V to −20 V
Discharge power of the assist plasma gun 153: no assist plasma gun was used
Vapor deposition time: vapor deposition was performed until the target layer thickness was achieved (refer to Table 10)

Specifically, hard coating layers with predetermined target layer thicknesses shown in Table 10 were formed under the formation conditions shown in Table 9, and comparative inserts b1 to b8 were produced as coated tools for comparison.

In addition, before and/or after forming the above-mentioned hard coating layer, an upper portion layer with an average layer thickness of 0.1 μm to 0.3 μm and a lower portion layer with an average layer thickness of 0.5 μm to 1.5 μm, which are made of any of TiN, (Ti,Al)N, Ti(C,N), (Al,Cr)N, and CrN, were formed by using a typical physical vapor deposition method, thereby producing each of invention inserts b9 to b14 and comparative inserts b9 to b12 shown in Tables 8 and 10.

Next, in a state where various inserts described above were screwed to the tip end portion of an insert holder of tool steel by a fixing jig, a dry intermittent high-speed cutting test was conducted on the invention inserts b1 to b14 and the comparative inserts b1 to b12 under the following cutting conditions A to C. In addition, the test was performed by setting the cutting speed under each of the conditions to be higher than a typical cutting speed.

(Cutting Condition A: Dry Intermittent High-Speed Cutting Test of Stainless Steel)
Workpiece: a round bar with two longitudinal grooves in the longitudinal direction formed at equal intervals of JIS.SUS-304 standard (corresponding to ISO TR 15510-6)
Cutting speed: 230 m/min. (typical cutting speed is 200 m/min.)
Cutting depth: 1.5 mm
Feed rate: 0.25 mm/rev.
Cutting time: 5 minutes
(Cutting Condition B: Dry Intermittent High-Speed Cutting Test of Carbon Steel)
Workpiece: a round bar with two longitudinal grooves in the longitudinal direction formed at equal intervals of JIS-S50C standard (corresponding to ISO 683-1-C50, C50E4, or C50M2)
Cutting speed: 220 m/min. (typical cutting speed: 220 m/min.)
Cutting depth: 2.0 mm
Feed rate: 0.25 mm/rev.
Cutting time: 5 minutes
(Cutting Condition C: Dry Intermittent High-Speed Cutting Test of Alloy Steel)
Workpiece: a round bar with four longitudinal grooves in the longitudinal direction formed at equal intervals of JIS-SCM440 standard (corresponding to ISO 683/1-42CrMo4 or ISO 683/1-42CrMoS4)
Cutting speed: 250 m/min. (typical cutting speed: 200 m/min.)
Cutting depth: 1.5 mm
Feed rate: 0.25 mm/rev.
Cutting time: 5 minutes Under such conditions, after performing the dry intermittent high-speed cutting test on the invention inserts b1 to b14 and the comparative inserts b1 to b12, the width of flank wear in the film thickness direction of the cutting edge was measured. The measurement results are shown in Table 11.

In addition, in the comparative inserts b1 to b12, significant wear had occurred due to chipping, fracturing, or the like of films. Regarding these inserts, a cutting life time (min:sec) until the maximum wear width exceeds 0.25 mm is written in Table 11 and is provided with an asterisk.

TABLE 7

Ion plating conditions using pressure-gradient type Ar plasma gun

| | Formation symbol | Plasma gun discharge power (kW) for metal Ti | Plasma gun discharge power (kW) for metal Al | Reaction gas (N$_2$) flow rate (sccm) | Discharge gas (Ar) flow rate (sccm) | Pressure in furnace (Pa) | Pulse configuration for one cycle (one cycle is 100 μsec) Bias voltage (V) | Pulse configuration for one cycle (one cycle is 100 μsec) Application time (μsec) | Bias voltage applied to tool body during OFF period (V) | Discharge power of assist plasma gun (kW) | Tool body temperature (° C.) |
|---|---|---|---|---|---|---|---|---|---|---|---|
| Invention insert formation conditions | 1 | 9 | 8 | 100 | 35 | 0.2 | −80 | 98 | −50 | 2 | 420 |
| | 2 | 9 | 8 | 100 | 35 | 0.2 | −90 | 98 | −50 | 2 | 420 |
| | 3 | 9 | 9 | 100 | 35 | 0.1 | −90 | 98 | −50 | 2 | 450 |
| | 4 | 9 | 9 | 100 | 35 | 0.1 | −90 | 98 | −50 | 2 | 420 |
| | 5 | 8 | 9 | 100 | 35 | 0.1 | −90 | 98 | −60 | 2 | 430 |
| | 6 | 8 | 9 | 100 | 35 | 0.1 | −90 | 98 | −60 | 2 | 430 |
| | 7 | 8 | 10 | 100 | 35 | 0.08 | −90 | 98 | −60 | 2 | 430 |
| | 8 | 8 | 10 | 100 | 35 | 0.08 | −90 | 98 | −60 | 2 | 430 |

TABLE 8

| | | | Lower portion layer | | | | | Hard coating layer | | |
|---|---|---|---|---|---|---|---|---|---|---|
| Type | Tool body symbol | Film type | Target layer thickness (μm) | Formation condition | Content x of Al in (Al$_x$Ti$_{1-x}$)N | Average grain size (nm) | Angular width (degrees) of diffraction arc of (200) of rock-salt structure | Angle φ (degrees) between diffraction arc center of (200) of rock-salt structure and tool body surface |
|---|---|---|---|---|---|---|---|---|
| Invention insert | b1 | A | — | — | 1 | 0.60 | 48 | 25 | 86 |
| | b2 | B | — | — | 2 | 0.60 | 42 | 26 | 86 |
| | b3 | C | — | — | 3 | 0.63 | 23 | 34 | 85 |
| | b4 | D | — | — | 4 | 0.63 | 25 | 32 | 83 |
| | b5 | E | — | — | 5 | 0.67 | 19 | 40 | 85 |
| | b6 | A | — | — | 6 | 0.67 | 16 | 48 | 85 |
| | b7 | B | — | — | 7 | 0.75 | 7 | 52 | 88 |
| | b8 | C | — | — | 8 | 0.75 | 8 | 55 | 86 |
| | b9 | D | (Al, Cr)N | 0.8 | 2 | 0.60 | 40 | 24 | 86 |
| | b10 | E | (Al, Cr)N | 0.5 | 3 | 0.63 | 25 | 33 | 87 |
| | b11 | A | TiN | 1.4 | 4 | 0.63 | 24 | 36 | 87 |
| | b12 | B | (Al, Cr)N | 0.8 | 5 | 0.67 | 20 | 40 | 88 |
| | b13 | C | Ti(C, N) | 0.8 | 6 | 0.67 | 15 | 43 | 86 |
| | b14 | D | (Al, Cr)N | 1.1 | 7 | 0.75 | 9 | 54 | 87 |

| | | Hard coating layer | | | | Upper portion layer | |
|---|---|---|---|---|---|---|---|
| Type | | Angular width (degrees) of diffraction arc of (11-20) of wurtzite structure | Angle φ (degrees) between diffraction arc center of (11-20) of wurtzite structure and tool body surface | Ic/(Ic + Ih) | Residual compressive stress (GPa) | Target layer thickness (μm) | Film type | Target layer thickness (μm) |
|---|---|---|---|---|---|---|---|---|
| Invention insert | b1 | 26 | 85 | 0.9** | 8 | 2.0 | — | — |
| | b2 | 20 | 85 | 0.8 | 8 | 3.0 | — | — |

TABLE 8-continued

| | | | | | | | | |
|---|---|---|---|---|---|---|---|---|
| | b3 | 28 | 89 | 0.8 | 8 | 3.5 | — | — |
| | b4 | 32 | 87 | 0.7 | 8 | 3.0 | — | — |
| | b5 | 40 | 89 | 0.7 | 10 | 3.5 | — | — |
| | b6 | 44 | 85 | 0.3 | 12 | 7.0 | — | — |
| | b7 | 52 | 86 | 0.3 | 10 | 4.0 | — | — |
| | b8 | 53 | 88 | 0.2** | 11 | 3.5 | — | — |
| | b9 | 25 | 84 | 0.8 | 8 | 2.0 | — | — |
| | b10 | 30 | 86 | 0.8 | 8 | 1.2 | — | — |
| | b11 | 30 | 85 | 0.7 | 8 | 1.0 | CrN | 0.2 |
| | b12 | 40 | 87 | 0.7 | 10 | 0.6 | TiN | 0.3 |
| | b13 | 45 | 85 | 0.3 | 10 | 1.5 | TiN | 0.2 |
| | b14 | 55 | 85 | 0.3 | 11 | 1.2 | Ti(C, N) | 0.1 |

TABLE 9

Ion plating conditions using pressure-gradient type Ar plasma gun

| | | | | | | Pulse configuration for one cycle (one cycle is 100 μsec) | | |
|---|---|---|---|---|---|---|---|---|
| | Formation symbol | Plasma gun discharge power (kW) for metal Ti | Plasma gun discharge power (kW) for metal Al | Reaction gas ($N_2$) flow rate (sccm) | Discharge gas (Ar) flow rate (sccm) | Pressure in furnace (Pa) | Bias voltage (V) | Application time (μsec) | Tool body temperature (° C.) |
| Comparative insert formation conditions | 1 | 9 | 8 | 100 | 35 | 0.2 | −10 | DC | 400 |
| | 2 | 9 | 8 | 100 | 35 | 0.2 | −10 | DC | 420 |
| | 3 | 9 | 9 | 100 | 35 | 0.1 | −10 | DC | 450 |
| | 4 | 9 | 9 | 100 | 35 | 0.1 | −10 | DC | 420 |
| | 5 | 8 | 9 | 100 | 35 | 0.1 | −20 | DC | 430 |
| | 6 | 8 | 9 | 100 | 35 | 0.1 | −20 | DC | 430 |
| | 7 | 8 | 10 | 100 | 35 | 0.08 | −20 | DC | 430 |
| | 8 | 8 | 10 | 100 | 35 | 0.08 | −20 | DC | 430 |

TABLE 10

| | | | Hard coating layer | | | | | |
|---|---|---|---|---|---|---|---|---|
| | | | Lower portion layer | | | | Angular width (degrees) of | Angle φ (degrees) between diffraction arc center of (200) of |
| Type | | Tool body symbol | Film type | Target layer thickness (μm) | Formation condition | Content x of Al in ($Al_xTi_{1-x}$)N | Average grain size (nm) | diffraction arc of (200) of rock-salt structure | rock-salt structure and tool body surface |
| Comparative insert | b1 | A | — | — | 1 | 0.60 | 102 | Entire circumference | — |
| | b2 | B | — | — | 2 | 0.60 | 80 | Entire circumference | — |
| | b3 | C | — | — | 3 | 0.63 | 75 | Entire circumference | — |
| | b4 | D | — | — | 4 | 0.63 | 86 | Entire circumference | — |
| | b5 | E | — | — | 5 | 0.67 | 32 | Entire circumference | — |
| | b6 | B | — | — | 6 | 0.67 | 34 | Entire circumference | — |
| | b7 | C | — | — | 7 | 0.75 | 26 | No arc | — |
| | b8 | D | — | — | 8 | 0.75 | 26 | No arc | — |
| | b9 | E | TiN | 1.5 | 2 | 0.60 | 106 | Entire circumference | — |
| | b10 | A | Ti(C, N) | 0.8 | 3 | 0.63 | 26 | Entire circumference | — |
| | b11 | B | Ti(C, N) | 0.8 | 4 | 0.63 | 26 | Entire circumference | — |
| | b12 | C | (Al, Cr)N | 1.1 | 5 | 0.67 | 27 | Entire circumference | — |

TABLE 10-continued

| | | Hard coating layer | | | | | Upper portion layer | |
|---|---|---|---|---|---|---|---|---|
| Type | | Angular width (degrees) of diffraction arc of (11-20) of wurtzite structure | Angle φ (degrees) between diffraction arc center of (11-20) of wurtzite structure and tool body surface | Ic/(Ic + Ih) | Residual compressive stress (GPa) | Target layer thickness (μm) | Film type | Target layer thickness (μm) |
| Comparative insert | b1 | No arc | — | 1 | 2 | 2.4 | — | — |
| | b2 | No arc | — | 1 | 2 | 3.1 | — | — |
| | b3 | No arc | — | 1 | 3 | 3.5 | — | — |
| | b4 | No arc | — | 1 | 2 | 2.4 | — | — |
| | b5 | Entire circumference | — | 0.5 | 5 | 3.5 | — | — |
| | b6 | Entire circumference | — | 0.5 | 4 | 6.5 | — | — |
| | b7 | Entire circumference | — | 0.3 | 4 | 4.0 | — | — |
| | b8 | Entire circumference | — | 0 | 4 | 3.2 | — | — |
| | b9 | No arc | — | 1 | 2 | 2.0 | — | — |
| | b10 | No arc | — | 1 | 3 | 1.4 | Ti(C, N) | 0.2 |
| | b11 | No arc | — | 1 | 4 | 1.2 | (Al, Cr)N | 0.3 |
| | b12 | Entire circumference | — | 0.2 | 5 | 0.8 | Ti(C, N) | 0.3 |

TABLE 11

| | | Flank wear width (mm) | | | | | Flank wear width (mm) or cutting life time (min) | | | |
|---|---|---|---|---|---|---|---|---|---|---|
| | Type | Cutting condition A | Cutting condition B | Cutting condition C | | Type | Cutting condition A | Cutting condition B | Cutting condition C | Primary cause for shorten life |
| Invention insert | b1 | 0.20 | 0.19 | 0.19 | Comparative insert | b1 | 1:30* | 2:30* | 2:00* | High wear amount |
| | b2 | 0.19 | 0.18 | 0.18 | | b2 | 2:30* | 2:30* | 2:30* | High wear amount |
| | b3 | 0.16 | 0.18 | 0.15 | | b3 | 2:30* | 3:00* | 2:30* | Chipping |
| | b4 | 0.16 | 0.17 | 0.14 | | b4 | 3:00* | 3:00* | 3:00* | Chipping |
| | b5 | 0.14 | 0.17 | 0.13 | | b5 | 3:30* | 3:30* | 3:00* | Chipping |
| | b6 | 0.15 | 0.16 | 0.15 | | b6 | 4:00* | 4:00* | 4:00* | High wear amount |
| | b7 | 0.19 | 0.14 | 0.15 | | b7 | 2:00* | 2:30* | 2:00* | High wear amount |
| | b8 | 0.14 | 0.15 | 0.16 | | b8 | 2:30* | 3:00* | 3:30* | High wear amount |
| | b9 | 0.12 | 0.10 | 0.12 | | b9 | 0.25 | 0.24 | 0.24 | Normal wear |
| | b10 | 0.13 | 0.11 | 0.10 | | b10 | 0.24 | 0.23 | 0.25 | Normal wear |
| | b11 | 0.09 | 0.10 | 0.10 | | b11 | 0.24 | 0.24 | 0.23 | Normal wear |
| | b12 | 0.11 | 0.10 | 0.11 | | b12 | 4:30* | 0.25 | 4:30* | High wear amount |
| | b13 | 0.13 | 0.12 | 0.12 | | | | | | |
| | b14 | 0.15 | 0.13 | 0.14 | | | | | | |

Moreover, thin pieces were cut from the (Al,Ti)N layers included in the hard coating layers of the invention inserts b1 to b14 and the comparative inserts b1 to b12 by focused ion beam processing. The thin pieces included the tool body and the hard coating layer from the flank face of the tool and had dimensions a width of 100 μm, a height of 300 μm, and a thickness of 0.2 μm. In addition, a direction parallel to the surface of the tool body is referred to as width, and a direction perpendicular to the surface of the tool body (film thickness direction) is referred to as height. In the thin pieces, a visual field which was set to include all of the thickness region of the hard coating layer, with a width of 10 μm and a height that was twice the average layer thickness of the hard coating layer, was observed by the transmission electron microscope, and thereby the crystal structure of crystal grains was determined from the electron diffraction pattern (see FIG. 6B). As a result, it was confirmed that the invention inserts b1 to b14 and the comparative inserts b1 to b12 had a mixed structure including both cubic crystal grains with a rock-salt structure in which the {200} plane was oriented in the direction perpendicular to the surface of the tool body and hexagonal crystal grains with a wurtzite structure in which the {11-20} plane was oriented in the same manner. At the same time, the cross-sections thereof were observed by a transmission electron microscope (the magnification was set to an appropriate value in a range of from 200,000 times to 1,000,000 times), and the average grain size was measured (see FIG. 6A). In a region of the (Al,Ti)N layer in the cross-sectional structure observation visual field of the hard coating layer of each of the invention inserts b1 to b14 and the comparative inserts b1 to b12, the major axis and the minor axis of the individual crystal grains in an area of the layer thickness of the (Al,Ti)N layer×5 μm were measured in the same manner as in Example 1, and the average value thereof was obtained as the average grain size of the crystal grain. The results are shown in Tables 8 and 10. The compositions of the (Al,Ti)N layers included in the hard coating layers of the invention inserts b1 to b14 and the comparative inserts b1 to b12 were measured by energy-dispersive X-ray spectroscopy using the transmission electron microscope, and all of the results showed substantially the same compositions as the target compositions shown in Tables 8 and 10.

In addition, the layer thicknesses of the hard coating layers of the invention inserts b1 to b14 and the comparative inserts b1 to b12 were observed by using a scanning electron microscope (the magnification was set to an appropriate value in a range of from 5000 times to 200,000 times), and the average layer thickness was obtained by measuring and averaging the layer thicknesses of five points in an observation visual field. All of the results showed substantially the same average layer thicknesses as the target layer thicknesses shown in Tables 8 and 10.

The residual compressive stress of each of the hard coating layers of the invention inserts b1 to b14 and the comparative inserts b1 to b12 was measured according to a $\sin^2\psi$ method by X-ray diffraction measurement using CuKα X-rays. The results are shown in Tables 8 and 10.

Figure 6B:
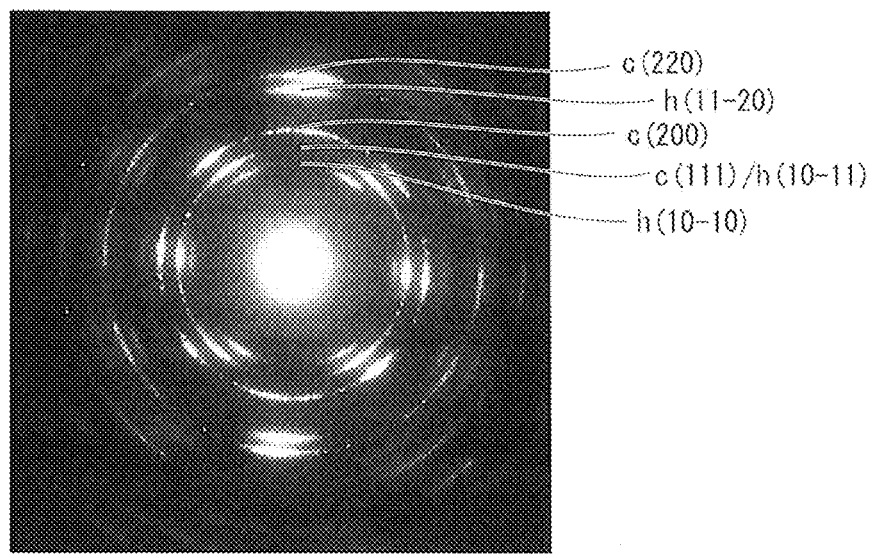
FIG. 6B is an electron diffraction pattern obtained by irradiating the cross-section of the hard coating layer of the coated tool according to the embodiment of the present invention with electron beams.
Figure 7:
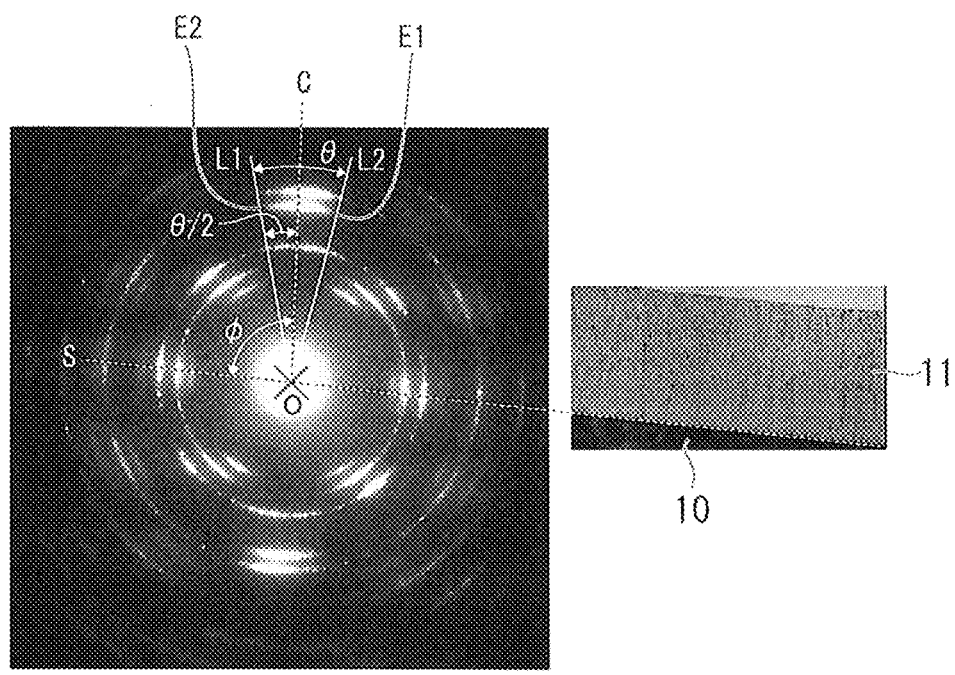
FIG. 7 is an example of an electron diffraction image showing angular widths, the midpoint of an opening angle, and the like in the hard coating layer of the coated tool according to the embodiment of the present invention.
Figure 8A:
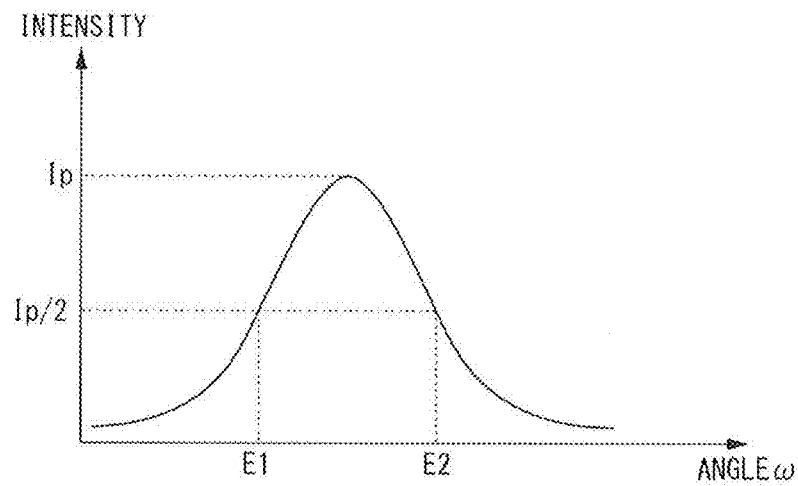
FIG. 8A is an example of an intensity profile showing the ends of an arc in the electron diffraction pattern.
Figure 8B:
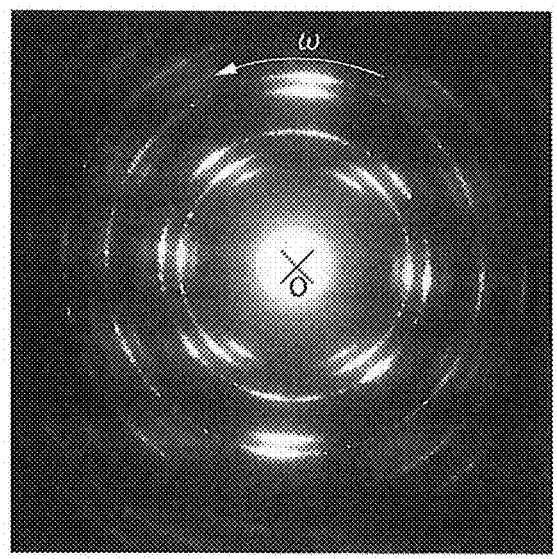
FIG. 8B is a view showing an angle in the electron diffraction pattern.

Furthermore, an electron diffraction pattern was observed in a state where electron beams having a spot diameter corresponding to the layer thickness of the hard coating layer were irradiated in the cross-sectional direction of the hard coating layer. FIGS. 6B, 7, and 8B are examples. As a result, in the invention inserts b1 to b14, portions of diffraction rings derived from the rock-salt structure and diffraction rings or arcs derived from the wurtzite structure were observed, and it was confirmed that both of the diffraction arc of the (200) plane of the rock-salt structure and the diffraction arc of the (11-20) plane of the wurtzite structure were not complete circles and were arcs. Regarding each of the diffraction arc of the (200) plane of the rock-salt structure and the diffraction arc of the (11-20) plane of the wurtzite structure, the angular width θ (central angle) of the arc was measured from the electron diffraction pattern (see FIGS. 7, 8A, and 8B). In addition, an angle φ (here, φ≤90°) between a straight line (a bisector of the angular width θ) connecting the radius center of the diffraction arc (the irradiation axis O of the electron beams) with the midpoint of the opening angle of the arc and the surface of the tool body, was measured. The results are shown in Table 8. Electron diffraction patterns of the comparative inserts b1 to b12 are as shown in Table 10. From the electron diffraction patterns, the diffraction pattern of the (200) plane of the rock-salt structure and the diffraction pattern of the (11-20) plane of the wurtzite structure were observed as diffraction rings, or no diffraction pattern was observed. Thus, diffraction patterns observed as arcs were not present. Therefore, the angular width θ and the angle φ could not be measured.

Moreover, the intensity profiles of the diffraction pattern of the (200) plane derived from the rock-salt structure in the direction perpendicular to the surface of the tool body and the diffraction pattern of the (11-20) plane derived from the wurtzite structure, were calculated from the electron diffraction pattern, and Ic/(Ic+Ih) was calculated, wherein the peak area of the (200) diffraction line of the rock-salt structure was referred to as an intensity Ic and the peak area of the (11-20) diffraction line of the wurtzite structure was referred to as an intensity Ih. The results are shown in Tables 8 and 10. In Table 8, results in which the value of Ic/(Ic+Ih) was not included in a range of 0.3 of 0.8 are provided with two asterisks.

According to Table 8, in the invention inserts b1 to b14, the composition of the hard coating layer was $(Ti_{1-x}Al_x)N$ (0.5≤x≤0.8), and the average grain size of the crystal grains was 5 nm and 50 nm. In addition, in the electron diffraction patterns (see FIG. 6B), since portions of diffraction rings derived from the rock-salt structure and diffraction rings or portions thereof derived from the wurtzite structure were observed, it could be seen that there were mixed structures including both the cubic crystal grains having the rock-salt structure and the hexagonal crystal grains having the wurtzite structure. In addition, since the angular widths θ of both of the diffraction are of the (200) plane of the rock-salt structure and the diffraction arc of the (11-20) plane of the wurtzite structure were 60 degrees or lower, and the angles φ thereof were 75 degrees to 90 degrees, it could be seen that the {200} planes of the cubic crystal grains and the {11-20} planes of the hexagonal crystal grains were oriented so as to be perpendicular to the surface of the tool body. Furthermore, it could be seen from Table 11 that in the invention inserts b1 to b14, the wear amount during cutting was small compared to the comparative inserts b1 to b12. That is, from the results shown in Tables 8 and 11, in the invention inserts b1 to b14, over the entire hard coating layer or the entire film, excellent fracturing resistance was provided, and excellent wear resistance was exhibited. Accordingly, it was apparent that excellent tool characteristics were exhibited over a long period of time without the occurrence of detachment, fracturing, and chipping.

On the other hand, according to Table 10, in the comparative inserts b1 to b12, the composition of the hard coating layer was $(Ti_{1-x}Al_x)N$(0.5≤x≤0.8). In addition, the average grain size of the crystal grains of the comparative inserts b5 to b8 and b10 to b12 was 5 nm to 50 nm. However, the hard coating layers of the comparative inserts b1 to b4 and b7 to b11 did not have mixed structures including both the cubic crystal grains having the rock-salt structure and the hexagonal crystal grains having the wurtzite structure, and the hard coating layer was formed of only one of the cubic crystal grains having the rock-salt structure and the hexagonal crystal grains having the wurtzite structure. In addition, although the hard coating layers of the comparative inserts b5, b6, and b12 had mixed structure including both the cubic crystal grains having the rock-salt structure and the hexagonal crystal grains having the wurtzite structure, the {200} planes of the cubic crystal grains and the {11-20} planes of the hexagonal crystal grains were not oriented perpendicular to the surface of the tool body. Therefore, over the entire hard coating layer or the entire film, fracturing resistance and wear resistance were deteriorated, and detachment, fracturing, and chipping had occurred. Accordingly, it was apparent that the comparative inserts reached the end of their service lives within a relatively short time.

According to Tables 8 and 11, the wear widths after the dry intermittent high-speed cutting test of the invention inserts b9 to b14 in which the lower portion layers were formed, were smaller than the wear widths of the invention inserts b1 to b8 in which the lower portion layers were not formed. From this, it can be seen that cutting performance is enhanced when the lower portion layer is formed. Furthermore, in the invention insert b11 having the lower portion layer formed of TiN and the upper portion layer formed of CrN, the wear width was smallest in any cutting conditions.

In the invention insert b1 in which the value of Ic/(Ic+Ih) is higher than 0.8, the wear width after the dry intermittent high-speed cutting test was higher than those of the other invention inserts.

According to Tables 8 and 11, since a relatively high residual compressive stress of 8 GPa to 12 GPa was imparted to the invention inserts b1 to b14, sufficient wear resistance could be obtained even when the average aspect ratio was not controlled unlike in Example 1.

INDUSTRIAL APPLICABILITY

The surface-coated cutting tool of the present invention exhibits excellent fracturing resistance, wear resistance, and excellent cutting performance over a long period of time, even during high-speed intermittent turning of high hardness steel such as stainless steel or alloy steel in which particularly high temperature heat is generated and a high burden is applied to a cutting edge portion, as well as during cutting of various types of steels and cast irons under typical cutting conditions. Accordingly, the surface-coated cutting tool sufficiently contributes to high performance of a cutting apparatus, power saving and energy saving during cutting, and a further reduction in cost.

In addition, the surface-coated cutting tool of the present invention, and particularly, the surface-coated cutting tool according to the second embodiment exhibits excellent fracturing resistance and wear resistance and exhibits excellent cutting performance over a long period of time, even during high-speed intermittent turning of alloy steel, stainless steel, or the like in which particularly high temperature heat is generated and a high burden is applied to a cutting edge portion, as well as during cutting of various types of steels and the like under typical cutting conditions. Accordingly, the surface-coated cutting tool sufficiently contributes to high performance of a cutting apparatus, power saving and energy saving during cutting, and a further reduction in cost.

REFERENCE SIGNS LIST

10 TOOL BODY
11 HARD COATING LAYER
12 LOWER PORTION LAYER
13 UPPER PORTION LAYER
22, 21 EVAPORATION SOURCE
50 PLASMA
100 ION PLATING APPARATUS
101 HOUSING
111, 112 PRESSURE-GRADIENT TYPE PLASMA GUN
121, 122 HEARTH
130 TOOL BODY HOLDER
140 HEATER
151, 152 REACTION GAS INTRODUCTION PORT
153 ASSIST PLASMA GUN
160 POWER SOURCE

The invention claimed is:

1. A surface-coated cutting tool comprising:
a hard coating layer which is vapor-deposited on a surface of a tool body made of a sintered tungsten carbide-based cemented carbide, wherein
(a) a composition of the hard coating layer is expressed by a composition formula of $(Al_xTi_{1-x})N$ ($0.5 \leq x \leq 0.8$), and an average layer thickness of the hard coating layer is 0.5 μm to 7.0 μm,
(b) the hard coating layer is formed of fine crystal grains having an average grain size of 5 nm to 50 nm,
(c) the fine crystal grains have a mixed structure including both cubic crystal grains having a rock-salt structure, and hexagonal crystal grains having a wurtzite structure, and
(d) {200} planes of the cubic crystal grains and {11-20} planes of the hexagonal crystal grains are oriented so as to be perpendicular to the surface of the tool body.

2. The surface-coated cutting tool according to claim 1, wherein the composition of the hard coating layer is expressed by a composition formula of $(Al_xTi_{1-x})N$ ($0.6 \leq x \leq 0.8$), and the average layer thickness of the hard coating layer is 0.5 μm to 5.0 μm, and
a compressive residual stress of the hard coating layer is 8 GPa to 12 GPa.

3. The surface-coated cutting tool according to claim 2, wherein the average aspect ratio of the fine crystal grains is 3 or lower.

4. The surface-coated cutting tool according to claim 2, wherein, in an electron diffraction pattern observed by irradiating electron beams focused so as to have a spot diameter corresponding to the layer thickness of the hard coating layer in a cross-sectional direction of the hard coating layer,
portions of diffraction rings derived from the rock-salt structure and portions of diffraction rings derived from the wurtzite structure are observed, and both a diffraction arc of a (200) plane of the rock-salt structure and a diffraction arc of a (11-20) plane of the wurtzite structure are not complete circles and are arcs, and
an angular width of each diffraction arc derived from the (200) plane of the rock-salt structure and the diffraction arc derived from the (11-20) plane of the wurtzite structure is 60 degrees or lower, and regarding each diffraction arc derived from the (200) plane of the rock-salt structure and the diffraction arc derived from the (11-20) plane of the wurtzite structure, an angle φ between a straight line connecting a radius center of the diffraction arc with a midpoint of an opening angle of the diffraction arc and the surface of the tool body is greater than or equal to 75 degrees and less than or equal to 90 degrees.

5. The surface-coated cutting tool according to claim 2, wherein, in an electron diffraction pattern observed by irradiating the electron beams in the cross-sectional direction of the hard coating layer,
in a case where an intensity profile of a diffraction pattern in the direction perpendicular to the surface of the tool body is calculated, when a diffraction intensity of the diffraction arc of the (200) plane of the rock-salt structure is referred to as Ic and a diffraction intensity of the diffraction arc of the (11-20) plane of the wurtzite structure is referred to as Ih,
$0.8 \geq Ic/(Ic+Ih) \geq 0.3$
is satisfied.

6. The surface-coated cutting tool according to claim 2, wherein an upper portion layer which is made of any of TiN, (Ti,Al)N, Ti(C,N), (Al,Cr)N, and CrN and has an average layer thickness of 0.1 μm to 0.3 μm is present at an upper layer of the hard coating layer, or a lower portion layer which is made of any of TiN, (Ti,Al)N, Ti(C,N), (Al,Cr)N, and CrN and has an average layer thickness of 0.5 μm to 1.5 μm is present at a lower layer of the hard coating layer.

7. The surface-coated cutting tool according to claim 1, wherein the average aspect ratio of the fine crystal grains is 3 or lower.

8. The surface-coated cutting tool according to claim 7, wherein, in an electron diffraction pattern observed by irradiating electron beams focused so as to have a spot diameter corresponding to the layer thickness of the hard coating layer in a cross-sectional direction of the hard coating layer, portions of diffraction rings derived from the rock-salt structure and portions of diffraction rings derived from the wurtzite structure are observed, and both a diffraction arc of a (200) plane of the rock-salt structure and a diffraction arc of a (11-20) plane of the wurtzite structure are not complete circles and are arcs, and an angular width of each diffraction arc derived from the (200) plane of the rock-salt structure and the diffraction arc derived from the (11-20) plane of the wurtzite structure is 60 degrees or lower, and regarding each diffraction arc derived from the (200) plane of the rock-salt structure and the diffraction arc derived from the (11-20) plane of the wurtzite structure, an angle φ between a straight line connecting a radius center of the diffraction arc with a midpoint of an opening angle of the diffraction arc and the surface of the tool body is greater than or equal to 75 degrees and less than or equal to 90 degrees.

9. The surface-coated cutting tool according to claim 7, wherein, in an electron diffraction pattern observed by irradiating the electron beams in the cross-sectional direction of the hard coating layer, in a case where an intensity profile of a diffraction pattern in the direction perpendicular to the surface of the tool body is calculated, when a diffraction intensity of the diffraction arc of the (200) plane of the rock-salt structure is referred to as Ic and a diffraction intensity of the diffraction arc of the (11-20) plane of the wurtzite structure is referred to as Ih, $0.8 \geq Ic/(Ic+Ih) \geq 0.3$ is satisfied.

10. The surface-coated cutting tool according to claim 7, wherein an upper portion layer which is made of any of TiN, (Ti,Al)N, Ti(C,N), (Al,Cr)N, and CrN and has an average layer thickness of 0.1 μm to 0.3 μm is present at an upper layer of the hard coating layer, or a lower portion layer which is made of any of TiN, (Ti,Al)N, Ti(C,N), (Al,Cr)N, and CrN and has an average layer thickness of 0.5 μm to 1.5 μm is present at a lower layer of the hard coating layer.

11. The surface-coated cutting tool according to claim 1, wherein, in an electron diffraction pattern observed by irradiating electron beams focused so as to have a spot diameter corresponding to the layer thickness of the hard coating layer in a cross-sectional direction of the hard coating layer, portions of diffraction rings derived from the rock-salt structure and portions of diffraction rings derived from the wurtzite structure are observed, and both a diffraction arc of a (200) plane of the rock-salt structure and a diffraction arc of a (11-20) plane of the wurtzite structure are not complete circles and are arcs, and an angular width of each diffraction arc derived from the (200) plane of the rock-salt structure and the diffraction arc derived from the (11-20) plane of the wurtzite structure is 60 degrees or lower, and regarding each diffraction arc derived from the (200) plane of the rock-salt structure and the diffraction arc derived from the (11-20) plane of the wurtzite structure, an angle φ between a straight line connecting a radius center of the diffraction arc with a midpoint of an opening angle of the diffraction arc and the surface of the tool body is greater than or equal to 75 degrees and less than or equal to 90 degrees.

12. The surface-coated cutting tool according to claim 11, wherein, in the electron diffraction pattern observed by irradiating the electron beams in the cross-sectional direction of the hard coating layer, in a case where an intensity profile of a diffraction pattern in the direction perpendicular to the surface of the tool body is calculated, when a diffraction intensity of the diffraction arc of the (200) plane of the rock-salt structure is referred to as Ic and a diffraction intensity of the diffraction arc of the (11-20) plane of the wurtzite structure is referred to as Ih, $0.8 \geq Ic/(Ic+Ih) \geq 0.3$ is satisfied.

13. The surface-coated cutting tool according to claim 11, wherein an upper portion layer which is made of any of TiN, (Ti,Al)N, Ti(C,N), (Al,Cr)N, and CrN and has an average layer thickness of 0.1 μm to 0.3 μm is present at an upper layer of the hard coating layer, or a lower portion layer which is made of any of TiN, (Ti,Al)N, Ti(C,N), (Al,Cr)N, and CrN and has an average layer thickness of 0.5 μm to 1.5 μm is present at a lower layer of the hard coating layer.

14. The surface-coated cutting tool according to claim 1, wherein, in an electron diffraction pattern observed by irradiating the electron beams in the cross-sectional direction of the hard coating layer, in a case where an intensity profile of a diffraction pattern in the direction perpendicular to the surface of the tool body is calculated, when a diffraction intensity of the diffraction arc of the (200) plane of the rock-salt structure is referred to as Ic and a diffraction intensity of the diffraction arc of the (11-20) plane of the wurtzite structure is referred to as Ih, $0.8 \geq Ic/(Ic+Ih) \geq 0.3$ is satisfied.

15. The surface-coated cutting tool according to claim 1, wherein an upper portion layer which is made of any of TiN, (Ti,Al)N, Ti(C,N), (Al,Cr)N, and CrN and has an average layer thickness of 0.1 μm to 0.3 μm is present at an upper layer of the hard coating layer, or a lower portion layer which is made of any of TiN, (Ti,Al)N, Ti(C,N), (Al,Cr)N, and CrN and has an average layer thickness of 0.5 μm to 1.5 μm is present at a lower layer of the hard coating layer.

16. The surface-coated cutting tool according to claim 1, wherein a lower portion layer which is made of any of TiN, (Ti,Al)N, Ti(C,N), (Al,Cr)N, and CrN and has an average layer thickness of 0.5 μm to 1.5 μm is formed at a lower layer of the hard coating layer.

17. The surface-coated cutting tool according to claim 16, wherein an upper portion layer which is made of any of TiN, (Ti,Al)N, Ti(C,N), (Al,Cr)N, and CrN and has an average layer thickness of 0.1 μm to 0.3 μm is formed at an upper layer of the hard coating layer.

18. The surface-coated cutting tool according to claim 17, wherein the lower portion layer is made of TiN, and the upper portion layer is made of CrN.

19. The surface-coated cutting tool according to claim 16, wherein the lower portion layer is made of (Al,Cr)N.

20. The surface-coated cutting tool according to claim 1, wherein an average aspect ratio of the fine crystal grains is 1.4 to 1.8.

* * * * *